(12) United States Patent
Kim et al.

(10) Patent No.: US 11,165,047 B2
(45) Date of Patent: Nov. 2, 2021

(54) DISPLAY DEVICE AND METHOD OF MANUFACTURING THE SAME

(71) Applicant: Samsung Display Co., LTD., Yongin-si (KR)

(72) Inventors: Hyun Kim, Seoul (KR); Sun Ho Kim, Seongnam-si (KR); Sun Hee Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/812,350

(22) Filed: Mar. 8, 2020

(65) Prior Publication Data

US 2020/0303684 A1  Sep. 24, 2020

(30) Foreign Application Priority Data

Mar. 22, 2019 (KR) .................... 10-2019-0033217

(51) Int. Cl.
  *H01L 51/52* (2006.01)
  *H01L 27/32* (2006.01)
  *H01L 51/00* (2006.01)
  *H01L 51/56* (2006.01)
  *G06F 3/044* (2006.01)

(52) U.S. Cl.
  CPC ........ *H01L 51/5275* (2013.01); *H01L 27/323* (2013.01); *H01L 27/3244* (2013.01); *H01L 51/0096* (2013.01); *H01L 51/5253* (2013.01); *H01L 51/56* (2013.01); *G06F 3/0445* (2019.05); *G06F 3/0446* (2019.05); *H01L 2227/323* (2013.01)

(58) Field of Classification Search
  CPC .............. H01L 51/5275; H01L 27/323; H01L 27/3244; H01L 51/0096; H01L 51/5253; H01L 51/56; H01L 2227/323; G06F 3/0445; G06F 3/0446
  See application file for complete search history.

(56) References Cited

U.S. PATENT DOCUMENTS

| | | | |
|---|---|---|---|
| 11,038,151 B2 * | 6/2021 | Ju | G06F 3/0412 |
| 2016/0285043 A1 * | 9/2016 | Lee | H01L 51/5253 |
| 2017/0287992 A1 | 10/2017 | Kwak et al. | |
| 2018/0122866 A1 | 5/2018 | Choi | |
| 2018/0190734 A1 | 7/2018 | Kang et al. | |
| 2019/0341428 A1 * | 11/2019 | Lee | H01L 51/5256 |
| 2020/0258956 A1 * | 8/2020 | Feng | H01L 27/322 |
| 2021/0159453 A1 * | 5/2021 | Takahashi | H01L 51/50 |

FOREIGN PATENT DOCUMENTS

KR  10-2017-0111827  10/2017

* cited by examiner

*Primary Examiner* — Matthew E Warren
(74) *Attorney, Agent, or Firm* — H.C. Park & Associates, PLC

(57) ABSTRACT

A display device including a display area and a non-display area, a substrate including a through hole in the display area, an element layer including an anode disposed on the substrate, a light emitting layer disposed on the anode, and a cathode disposed on the light emitting layer, and a thin-film encapsulation layer including a first inorganic layer disposed on the element layer, an organic layer disposed on the first inorganic layer, and a second inorganic layer disposed on the organic layer, in which the first inorganic layer includes a plurality of first refractors having a first inclination angle.

17 Claims, 21 Drawing Sheets

DISPLAY DEVICE AND METHOD OF MANUFACTURING THE SAME

CROSS-REFERENCE TO RELATED APPLICATION

This application claims priority from and the benefit of Korean Patent Application No. 10-2019-0033217, filed on Mar. 22, 2019, which is hereby incorporated by reference for all purposes as if fully set forth herein.

BACKGROUND

Field

Exemplary embodiments of the invention relate generally to a display device and a method of manufacturing the same.

Discussion of the Background

Display devices are becoming increasingly important with the development of multimedia. Accordingly, various types of display devices, such as liquid crystal displays (LCDs) and organic light emitting displays (OLEDs), are being used. Among these display devices, OLEDs, which are self-light emitting devices, are drawing attention as next-generation display devices due to their excellent viewing angle.

With the usage of display devices in various electronic devices, there is a growing demand for a technology that, in designing the shape of a display device, increases the proportion of a display area where an image is provided and reduces the proportion of a peripheral area where relatively no image is provided. A display device may include, in a display area, a hole in which an electronic element, such as a camera, a photo-sensing element, a heat sensing element, etc. is disposed.

The above information disclosed in this Background section is only for understanding of the background of the inventive concepts, and, therefore, it may contain information that does not constitute prior art.

SUMMARY

Display devices constructed according to exemplary embodiments of the invention have an increased proportion of display area and improved display quality.

Additional features of the inventive concepts will be set forth in the description which follows, and in part will be apparent from the description, or may be learned by practice of the inventive concepts.

A display device according to an exemplary embodiment includes a display area and a non-display area, a substrate including a through hole in the display area, an element layer including an anode disposed on the substrate, a light emitting layer disposed on the anode, and a cathode disposed on the light emitting layer, and a thin-film encapsulation layer including a first inorganic layer disposed on the element layer, an organic layer disposed on the first inorganic layer, and a second inorganic layer disposed on the organic layer, in which the first inorganic layer includes a plurality of first refractors having a first inclination angle.

The first refractors may be disposed on the cathode.

The first inclination angle may define a degree of inclination with respect to an imaginary line substantially perpendicular to an upper surface of the cathode.

A path of light emitted from the light emitting layer may be configured to be refracted to the greater extent as the first inclination angle increases.

The first inorganic layer may further include a plurality of first voids formed between the first refractors.

At least a portion of the first voids may be filled with the organic layer.

The non-display area may include a hole peripheral area along a rim of the through hole.

The non-display area may further include a peripheral area, and the light emitting layer may have a first light emitting area and a second light emitting area disposed in the display area, and a third light emitting area disposed in the peripheral area.

Light emitted from the first light emitting area may be configured to pass through the first refractors and travel to a first virtual light emitting area overlapping the through hole.

Light emitted from the second light emitting area may be configured to pass through the first refractors and travel to a second virtual light emitting area overlapping the hole peripheral area.

Light emitted from the third light emitting area may be configured to pass through the first refractors and travel to a third virtual light emitting area overlapping the display area.

The second inorganic layer may include second refractors having a second inclination angle.

The second inclination angle may be the same as the first inclination angle.

The second inclination angle may be greater than the first inclination angle.

The display device may further include a third inorganic layer disposed on the second inorganic layer.

The second inorganic layer may include a plurality of second voids formed between the second refractors.

At least a portion of the second voids may be filled with the third inorganic layer.

A method of manufacturing a display device according to another exemplary embodiment includes forming an element layer on a substrate having a through hole in a display area, the element layer including an anode, a light emitting layer, and a cathode sequentially disposed on the substrate, forming a thin-film encapsulation layer on the element layer including forming a first inorganic layer including a plurality of first refractors having a first inclination angle, forming an organic layer disposed on the first inorganic layer, and forming a second inorganic layer disposed on the organic layer.

Forming the first inorganic layer may include forming a film while the substrate is placed to form a first angle with respect to an imaginary line substantially perpendicular to a surface from which a source is emitted, and an upper surface of the substrate is kept constant.

After the first refractors having a first directionality are formed using an anti-deposition plate, the substrate may be rotated such that the first refractors having a second directionality different from the first directionality are formed on the first inorganic layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
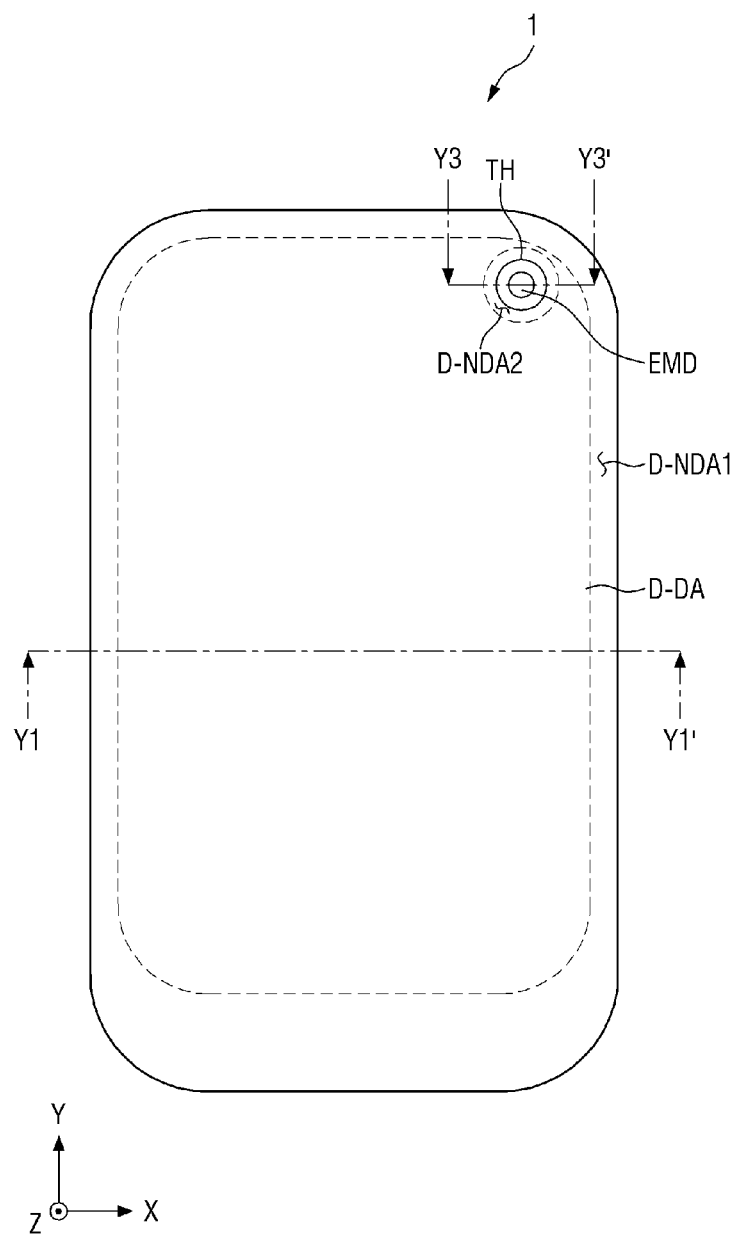
FIG. 1 is a schematic plan view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
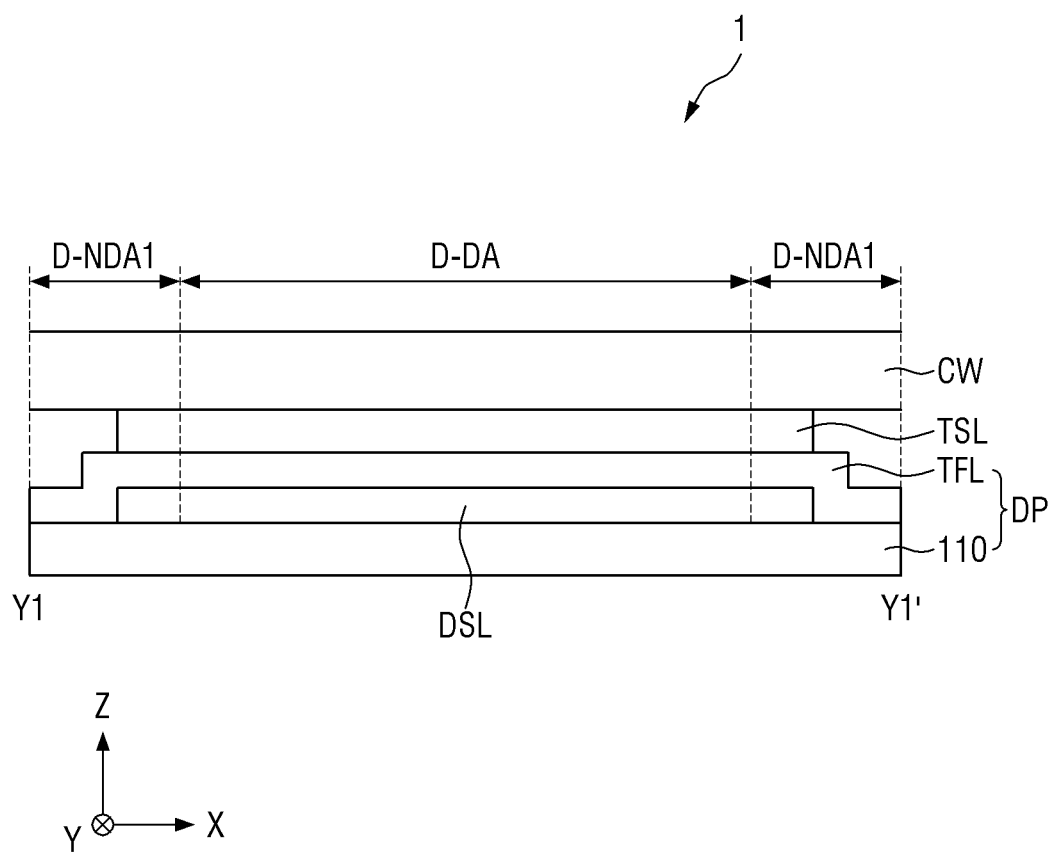
FIG. 2 is a schematic cross-sectional view taken along Y1-Y1' of the display device of FIG. 1 according to an exemplary embodiment
Figure 3:
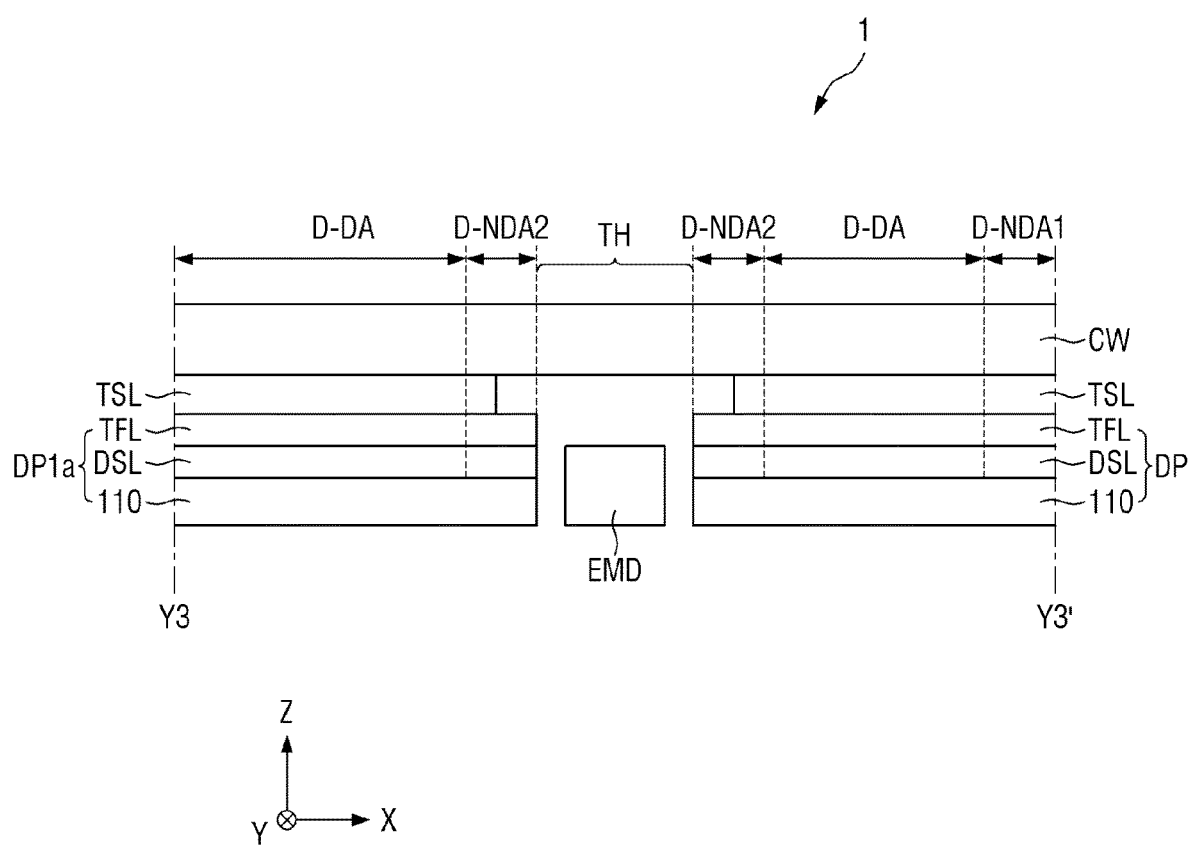
FIG. 3 is a schematic cross-sectional view taken along Y3-Y3' of the display device FIG. 1 according to an exemplary embodiment.
Figure 4:
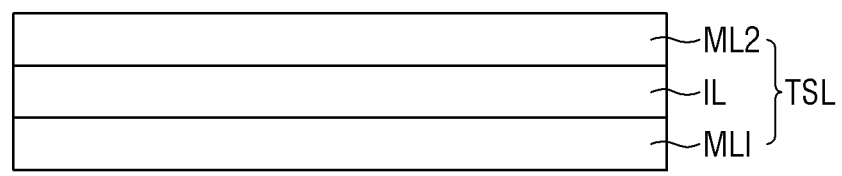
FIG. 4 is an enlarged cross-sectional view of a touch sensor illustrated in FIGS. 2 and 3.
Figure 5:
FIG. 5 is an enlarged cross-sectional view of an upper insulating layer illustrated in FIGS. 2 and 3.

FIG. 1 is a schematic plan view of a display device according to an exemplary embodiment. FIG. 2 is a schematic cross-sectional view taken along Y1-Y1' of the display device of FIG. 1 according to an exemplary embodiment. FIG. 3 is a schematic cross-sectional view taken along Y3-Y3' of the display device of FIG. 1 according to an exemplary embodiment. FIG. 4 is an enlarged cross-sectional view of a touch sensor TSL illustrated in FIGS. 2 and 3. FIG. 5 is an enlarged cross-sectional view of an upper insulating layer TSL illustrated in FIGS. 2 and 3.

Referring to FIGS. 1 through 5, the display device 1 according to the illustrated exemplary embodiment may include short sides extending in a first direction (e.g., x-direction) and long sides extending in a second direction (e.g., y-direction) intersecting the first direction. Each corner where a long side and a short side of the display device 1 meet may have a curved shape. The planar shape of the display device 1 is not limited to that shown in FIG. 1, and may have a circular shape or other shapes.

In FIG. 1, a portable terminal is illustrated as an example to which the display device 1 may be applied. The portable terminal may include, for example, a tablet personal computer (PC), a smartphone, a personal digital assistant (PDA), a portable multimedia player (PMP), a game machine, and a wristwatch-type electronic device. However, the inventive concepts are not limited to a specific type of the display device 1. In some exemplary embodiments, the display device 1 may be used in large-sized electronic devices, such as televisions and external billboards, and small and medium-sized electronic devices, such as PCs, notebook computers, car navigation devices, smart watches, and cameras.

As for the planar structure of the display device 1, the display device 1 includes a display area D-DA and a peripheral area D-NDA adjacent to the display area D-DA. The display area D-DA may be an area, in which an image is displayed, and the peripheral area D-NDA may be an area, in most of which an image may not be displayed. In some exemplary embodiments, however, an image may be displayed in a portion of the peripheral area D-NDA adjacent to the display area D-DA.

In some exemplary embodiments, the display area D-DA may have substantially a quadrilateral shape. In some exemplary embodiments, each corner of the display area D-DA may be curved or rounded in plan view, as illustrated in FIG. 1.

The peripheral area D-NDA may surround the display area D-DA. However, the inventive concepts are not limited thereto, and the shape of the display area D-DA and the shape of the peripheral area D-NDA can be variously designed.

The display device 1 may include a through hole TH in the display area D-DA. For example, the through hole TH may be located near a corner where a long side and a short side of the display device 1 meet. In some exemplary embodiments, the through hole TH may pass through the display device 1 along a third direction (e.g., z-direction), and an electronic element EMD may be disposed in the through hole TH. The electronic element EMD may be a camera element, a speaker element, a photo-sensing element, a heat sensing element, a microphone element, or the like.

The planar shape of the through hole TH may be a circular shape as illustrated in the drawings. However, the inventive concepts are not limited to one planar shape of the through hole TH, and in some exemplary embodiments, the planar shape of the through hole TH may have various other shapes, such as a polygonal shape, a combination of a straight line and a curve, and an elliptical shape. The peripheral area D-NDA may include a peripheral area D-NDA1 adjacent to the outside of the display area D-DA and a hole peripheral area D-NDA2 surrounding the through hole TH.

The display area D-DA may be an area, in which an image is displayed, and the peripheral area D-NDA1 and the hole peripheral area D-NDA2 may be areas, in most of which an image may not be displayed. In some exemplary embodiments, however, an image may be displayed in a part of each of the peripheral area D-NDA1 and the hole peripheral area D-NDA2 adjacent to the display area D-DA.

The peripheral area D-NDA1 may surround the display area D-DA, and the display area D-DA may surround the hole peripheral area D-NDA2.

As for the stacked structure of the display device 1, the display device 1 may include a display panel DP, the touch sensor TSL disposed on the display panel DP, and a cover window CW disposed on the touch sensor TSL.

In some exemplary embodiments, the display panel DP may be a display panel including a self-light emitting element. In an exemplary embodiment, the self-light emitting element may include at least one of an organic light emitting diode, a quantum dot light emitting diode, an inorganic material-based micro light emitting diode (e.g., a micro light emitting diode), and an inorganic material-based nano light emitting diode (e.g., a nano light emitting diode). Hereinafter the self-light emitting element will be described with reference to an organic light emitting diode.

In its stacked structure, the display panel DP includes a first substrate 110, an element layer DSL disposed on the first substrate 110, and the upper insulating layer TFL disposed on the element layer DSL.

The first substrate 110 is a substrate, which supports the element layer DSL. In some exemplary embodiments, the first substrate 110 may be an insulating substrate made of glass, quartz, ceramic, or plastic.

The element layer DSL is disposed on the first substrate 110. In some exemplary embodiments, the element layer DSL may include a plurality of pixels and a plurality of display signal lines disposed on the first substrate 110. Each of the pixels may include a thin-film transistor (TFT), a capacitor, and a light emitting element, which will be described in more detail later. The signal lines may include scan lines, which transmit scan signals to the pixels, and data lines, which transmit data signals to the pixels, respectively.

In some exemplary embodiments, the pixels included in the element layer DSL may be disposed in the display area D-DA, and some of the pixels may be further disposed in the peripheral area D-NDA.

The element layer DSL may further include elements and wirings disposed on the first substrate 110 and in the peripheral area D-NDA. The elements and the wirings may generate various signals to be transmitted to the pixels or may transmit the signals to the pixels.

The upper insulating layer TFL may be disposed on the element layer DSL. The upper insulating layer TFL may protect the element layer DSL.

The upper insulating layer TFL may include a thin-film encapsulation layer TFE, and may further include a capping layer CPL.

The upper insulating layer TFL may include a plurality of thin films. In the illustrated exemplary embodiment, the upper insulating layer TFL may include the capping layer CPL and the thin-film encapsulation layer TFE. The thin-film encapsulation layer TFE may include a first inorganic layer IOL1, an organic layer OL, and a second inorganic layer IOL2.

The capping layer CPL may be disposed on the element layer DSL and, in some exemplary embodiments, may be disposed on a cathode of the element layer DSL. In some exemplary embodiments, the capping layer CPL may contact the cathode. The capping layer CPL may include an organic material.

The thin-film encapsulation layer TFE may include the first inorganic layer IOL1, the organic layer OL, and the second inorganic layer IOL2.

The first inorganic layer IOL1 is disposed on the capping layer CPL and contacts the capping layer CPL. The organic layer OL is disposed on the first inorganic layer IOL1 and contacts the first inorganic layer IOL1. The second inorganic layer IOL2 is disposed on the organic layer OL and contacts the organic layer OL.

The capping layer CPL protects the cathode from a subsequent manufacturing process, such as a sputtering process, and improves the light output efficiency of light emitting elements.

The first inorganic layer IOL1 and the second inorganic layer IOL2 protect the element layer DSL from moisture/oxygen, and the organic layer OL protects the element layer DSL from foreign matter, such as dust particles. The first inorganic layer IOL1 and/or the second inorganic layer IOL2 may include refractors having a predetermined inclination angle. The refractors having the predetermined inclination angle may change the path of light passing through the first inorganic layer IOL1 and/or the second inorganic layer IOL2, which will be described in more detail later.

The touch sensor TSL may be disposed on the display panel DP. In some exemplary embodiments, the touch sensor TSL may obtain coordinates of a touch input point using a capacitance method. In the capacitance method, coordinate information of a touched point may be obtained using a self-capacitance method or a mutual capacitance method. Hereinafter, the touch sensor TSL will be described as having a mutual capacitance structure, however, the inventive concepts are not limited to one particular structure of the touch sensor TSL.

In some exemplary embodiments, a portion of the touch sensor TSL disposed in the display area D-DA may include a touch electrode, and a portion of the touch sensor TSL disposed in the peripheral area D-NDA may include a touch signal line, which transmits and/or receives a signal to/from the touch electrode and a touch pad portion connected to the touch signal line. The touch sensor TSL may be disposed on the upper insulating layer TFL. In some exemplary embodiments, the touch sensor TSL may be disposed on the thin-film encapsulation layer TFE, and a bonding layer (e.g., an adhesive layer) may not be disposed between the thin-film encapsulation layer TFE and the touch sensor TSL. For example, at least any one of the touch electrode, the touch signal line, and the touch pad portion of the touch sensor TSL may be disposed directly on the thin-film encapsulation layer TFE. Alternatively, when an insulating film is disposed between the touch sensor TSL and the thin-film encapsulation layer TFE, at least any one of the touch electrode, the touch signal line, and the touch pad portion of the touch sensor TSL may be disposed directly on the insulating film.

As for the stacked structure of the touch sensor TSL, the touch sensor TSL may include a first conductive layer ML1, an insulating layer IL, and a second conductive layer ML2, as illustrated in FIG. 4.

In some exemplary embodiments, the first conductive layer ML1 and the second conductive layer ML2 may include a conductive material having light transmitting properties, such as silver nanowires (AgNWs), indium tin oxide (ITO), indium zinc oxide (IZO), antimony zinc oxide (AZO), indium tin zinc oxide (ITZO), zinc oxide (ZnO), tin oxide ($SnO_2$), carbon nanotubes, graphene, and conductive polymers (e.g., PEDOT). Alternatively, the second conductive layer ML2 may include a conductive material, such as a metal or an alloy of metals, as long as light can be transmitted through the second conductive layer ML2. For example, the metal may include gold (Au), silver, (Ag), aluminum (Al), molybdenum (Mo), chromium (Cr), titanium (Ti), nickel (Ni), neodymium (Nd), copper (Cu), and platinum (Pt). In some exemplary embodiments, when the second conductive layer ML2 is made of a metal or an alloy of metals, the second conductive layer ML2 may have a mesh structure so as not to be visible to a user.

The insulating layer IL may be disposed between the first conductive layer ML1 and the second conductive layer ML2. In some exemplary embodiments, the insulating layer IL may include an insulating material, such as an inorganic insulating material or an organic insulating material. The inorganic insulating material may include at least one of aluminum oxide, titanium oxide, silicon oxide, silicon oxynitride, zirconium oxide, and hafnium oxide. The organic insulating material may include at least any one of acrylic resin, methacrylic resin, polyisoprene, vinyl resin, epoxy resin, urethane resin, cellulose resin, siloxane resin, polyimide resin, polyamide resin, and perylene resin.

The cover window CW is disposed on the display panel DP and protects the display panel DP from external impact or the like. The cover window CW may be formed as a film including a transparent material, such as tempered glass or plastic.

Figure 6:
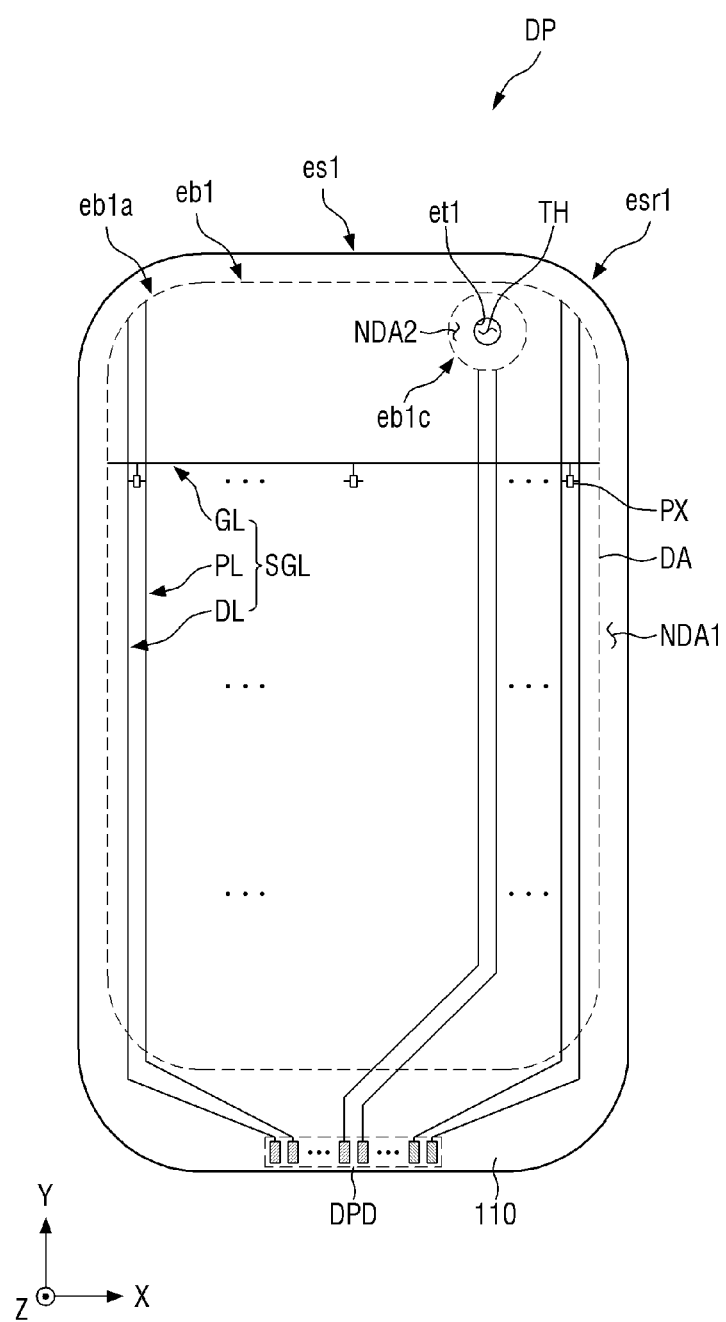
FIG. 6 is a schematic plan view of a display panel included in the display device according to an exemplary embodiment.
Figure 7:
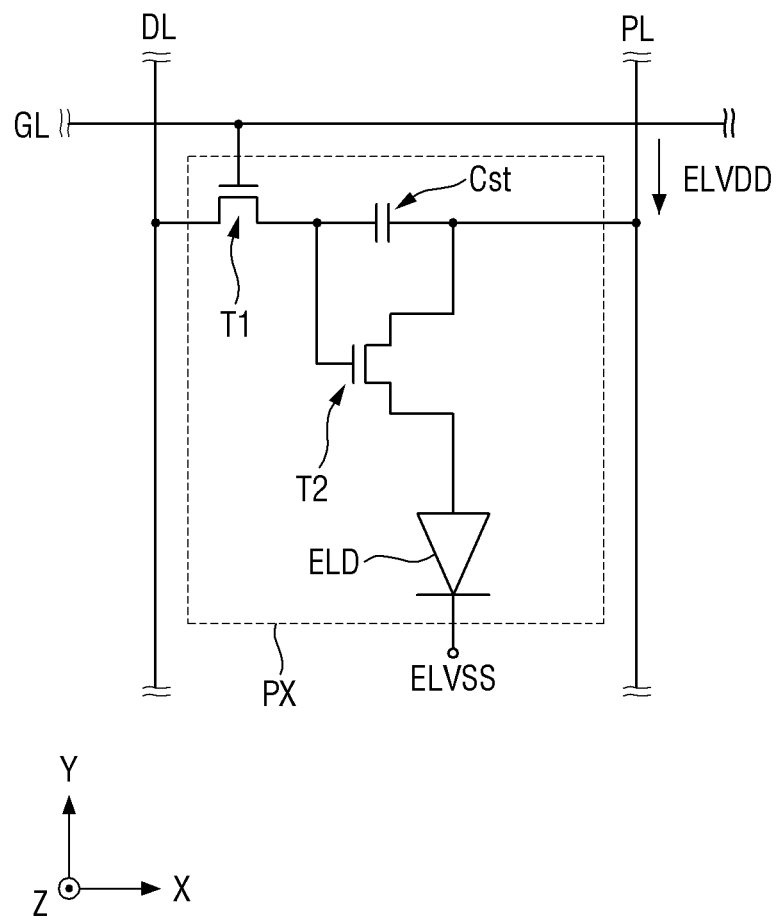
FIG. 7 is an equivalent circuit diagram of a pixel illustrated in FIG. 6.
Figure 8:
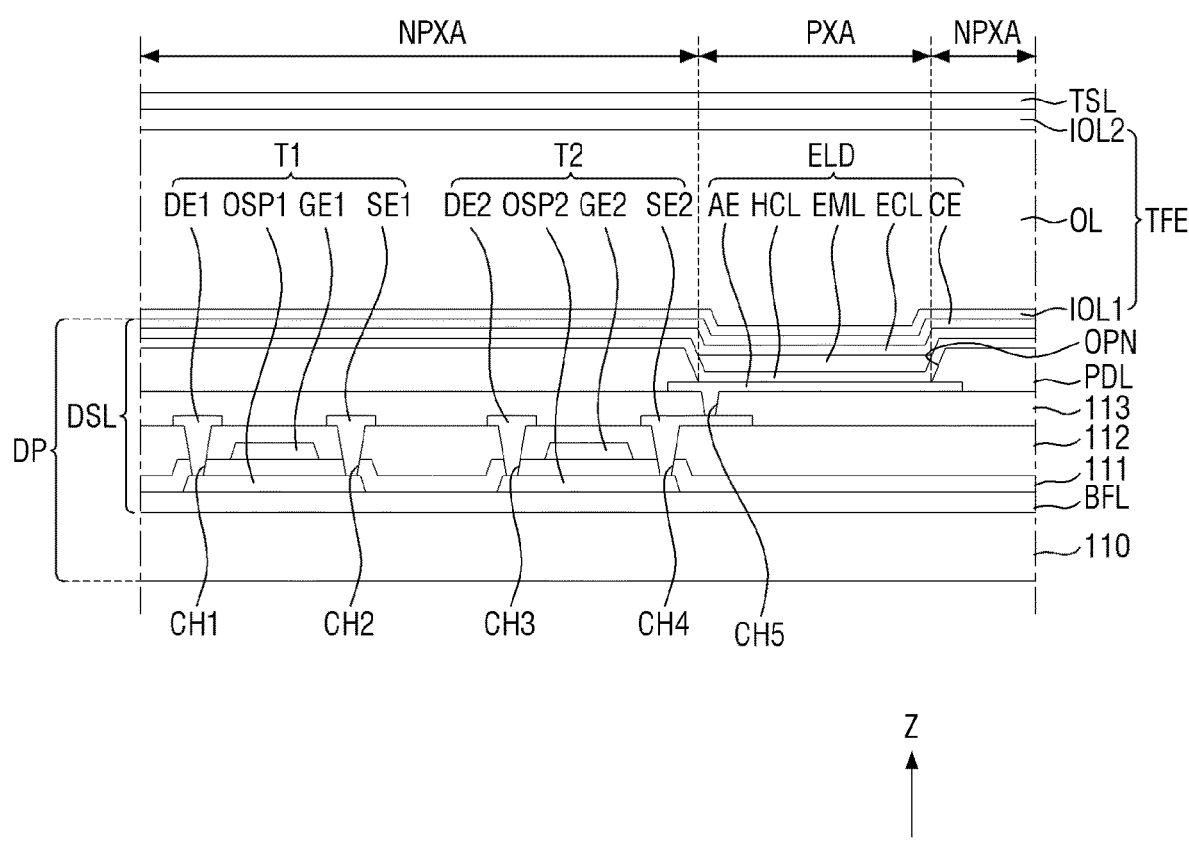
FIG. 8 is a schematic cross-sectional view of the pixel illustrated in FIG. 7.

FIG. 6 is a schematic plan view of the display panel DP included in the display device 1 according to an exemplary embodiment. FIG. 7 is an equivalent circuit diagram of a pixel PX illustrated in FIG. 6. FIG. 8 is a schematic cross-sectional view of the pixel PX illustrated in FIG. 7.

Referring to FIGS. 6 through 8, a display area DA, a peripheral area NDA1, and a hole peripheral area NDA2, which correspond to the display area D-DA, the peripheral area D-NDA1, and the hole peripheral area D-NDA2 of the display device 1, respectively, may be defined in the display panel DP or the first substrate 110. In the illustrated exemplary embodiment, when two regions are described as being corresponding to each other, the two regions may overlap each other and have the same area.

An edge "es1" of the first substrate 110 may include rounded portions "esr1" at corners. In addition, the first substrate 110 may further include a hole edge "et1" located around the through hole TH to define the through hole TH.

A boundary "eb1" between the display area DA and the peripheral area NDA1 of the display panel DP may include rounded portions "eb1a" at corners. In addition, a boundary "eb1c" between the display area DA and the hole peripheral area NDA2 of the display panel DP may include a rounded portion, and its overall shape may be substantially the same (e.g., a circular shape) as the planar shape of the through hole TH.

A plurality of signal lines SGL and a plurality of pixels PX may be disposed on the first substrate 110 in the display area DA. Signal pads DPD may be disposed on the first substrate 110 in the peripheral area NDA. Most of the pixels PX may be disposed in the display area DA. Some of the pixels PX may be disposed in the peripheral area NDA1, and the other pixels PX may be disposed in the hole peripheral area NDA2.

The signal lines SGL, the pixels PX, and the signal pads DPD may be included in the element layer DSL.

The signal lines SGL may include scan lines GL, data lines D,L and a power supply line PL.

The scan lines GL are connected to corresponding ones of the pixels PX, and transmit scan signals to the corresponding pixels PX, respectively.

The data lines DL are connected to corresponding ones of the pixels PX, and transmit data signals to the corresponding pixels PX, respectively.

The power supply line PL is connected to the pixels PX, and transmits a driving voltage to the pixels PX.

The signal pads DPD are disposed in the peripheral area NDA1, and may be connected to, for example, the signal lines SGL and the data lines DL, respectively. The signal pads DPD may receive data signals from an external source.

In some exemplary embodiments, the scan lines GL may extend along the first direction (e.g., x-direction), and the data lines DL may extend along the second direction (e.g., y-direction). In some exemplary embodiments, the power supply line PL may extend along the second direction as the data lines DL.

In FIG. 7, any one scan line GL, any one data line DL, the power supply line PL, and a pixel PX connected to these lines are illustrated. However, the inventive concepts are not limited to a particular configuration of the pixel PX, such that as shown in FIG. 7.

A light emitting element ELD may be a top emission diode or a bottom emission diode. As a pixel driving circuit for driving the light emitting element ELD, the pixel PX includes a first transistor T1 (or a switching transistor), a second transistor T2 (or a driving transistor), and a capacitor Cst. A first power supply voltage ELVDD is provided to the second transistor T2, and a second power supply voltage ELVSS is provided to the light emitting element ELD. The second power supply voltage ELVSS may be lower than the first power supply voltage ELVDD.

The first transistor T1 outputs a data signal transmitted to the data line DL, in response to a scan signal transmitted to the scan line GL. The capacitor Cst is charged with a voltage corresponding to the data signal received from the first transistor T1. The second transistor T2 is connected to the light emitting element ELD. The second transistor T2 controls a driving current flowing through the light emitting element ELD according to the amount of charges stored in the capacitor Cst.

The equivalent circuit of a pixel PX shown in FIG. 7 is merely an exemplary, and the inventive concepts are not limited thereto. For example, in some exemplary embodiments, the pixel PX may further include a plurality of transistors and more capacitors. The light emitting element ELD can also be connected between the power supply line PL and the second transistor T2.

In some exemplary embodiments, the light emitting element ELD may be an organic light emitting diode as described above. Alternatively, the light emitting element ELD may be any one of a quantum dot light emitting diode, an inorganic material-based micro light emitting diode, and an inorganic material-based nano light emitting diode, without being limited thereto.

FIG. 8 is a cross-sectional view of a portion of the display panel DP, which corresponds to the equivalent circuit of FIG. 7, together with the thin-film encapsulation layer TFE and the touch sensor TSL.

A buffer layer BFL may be disposed on the first substrate 110.

A semiconductor pattern OSP1 (hereinafter, referred to as a first semiconductor pattern) of the first transistor T1 and a semiconductor pattern OSP2 (hereinafter, referred to as a second semiconductor pattern) of the second transistor T2 may be disposed on the buffer layer BFL. Each of the first semiconductor pattern OSP1 and the second semiconductor pattern OSP2 may include at least one of amorphous silicon, polysilicon, and a metal oxide semiconductor. In some exemplary embodiments, any one of the first semiconductor pattern OSP1 and the second semiconductor pattern OSP2 may be made of polysilicon, and the other one of the first semiconductor pattern OSP1 and the second semiconductor pattern OSP2 may be made of a metal oxide semiconductor.

A first intermediate inorganic layer 111 is disposed on the first semiconductor pattern OSP1 and the second semiconductor pattern OSP2. A control electrode GE1 (hereinafter, referred to as a first control electrode) of the first transistor T1 and a control electrode GE2 (hereinafter, a second control electrode) of the second transistor T2 are disposed on the first intermediate inorganic layer 111. When the first control electrode GE1 and the second control electrode GE2 are disposed on the same layer, the first control electrode GE1 and the second control electrode GE2 may be manufactured by the same photolithography process as the scan lines GL (see FIG. 6). However, the inventive concepts are not limited thereto, and the first control electrode GE1 and the second control electrode GE2 may be disposed on different layers. In this case, any one of the first control electrode GE1 and the second control electrode GE2 may be manufactured by the same photolithography process as the scan lines GL (see FIG. 6).

A second intermediate inorganic layer 112 covering the first control electrode GE1 and the second control electrode GE2 is disposed on the first intermediate inorganic layer 111. An input electrode DE1 (hereinafter, referred to as a first input electrode) and an output electrode SE1 (hereinafter, referred to as a first output electrode) of the first transistor T1 and an input electrode DE2 (hereinafter, referred to as a second input electrode) and an output electrode SE2 (hereinafter, referred to as a second output electrode) of the second transistor T2 are disposed on the second intermediate inorganic layer 112.

The first input electrode DE1 and the first output electrode SE1 are connected to the first semiconductor pattern OSP1, respectively, through a first through hole CH1 and a second through hole CH2 passing through the first intermediate inorganic layer 111 and the second intermediate inorganic layer 112. The second input electrode DE2 and the second output electrode SE2 are connected to the second semiconductor pattern OSP2, respectively, through a third through hole CH3 and a fourth through hole CH4 passing through the first intermediate inorganic layer 111 and the second intermediate inorganic layer 112. In some exemplary embodiments, one of the first transistor T1 and the second transistor T2 may have a bottom gate structure.

An intermediate organic layer 113 covering the first input electrode DE1, the second input electrode DE2, the first output electrode SE1, and the second output electrode SE2 is disposed on the second intermediate inorganic layer 112. The intermediate organic layer 113 may provide a flat surface.

A pixel defining layer PDL and the light emitting element ELD may be disposed on the intermediate organic layer 113. The pixel defining layer PDL may include an organic material. An anode AE is disposed on the intermediate organic layer 113. The anode AE is connected to the second output electrode SE2 through a fifth through hole CH5 passing through the intermediate organic layer 113. An opening OPN is defined in the pixel defining layer PDL. The opening OPN of the pixel defining layer PDL exposes at least a portion of the anode AE. In some exemplary embodiments, the pixel defining layer PDL may be omitted.

The pixel PX may be disposed in the display area DA. The display area DA may include a light emitting area PXA and a non-light emitting area NPXA adjacent to the light emitting area PXA. The non-light emitting area NPXA may surround the light emitting area PXA. In the illustrated exemplary embodiment, the light emitting area PXA is defined to correspond to a portion of the anode AE exposed by the opening OPN.

In an exemplary embodiment, the light emitting area PXA may overlap at least one of the first and second transistors T1 and T2. In this manner, the opening OPN may become wider, and the anode AE and a light emitting layer EML to be described later may also become wider.

A hole control layer HCL may be common to each of the light emitting area PXA and the non-light emitting area NPXA. In some exemplary embodiments, a common layer, such as the hole control layer HCL, may be formed in common to each of the pixels PX (see FIG. 3 (6)).

The light emitting layer EML is disposed on the hole control layer HCL. The light emitting layer EML may generate light of a predetermined color. The light emitting layer EML may be disposed in an area corresponding to the opening OPN. More particularly, the light emitting layer EML may be formed separately in each pixel PX.

When the light emitting element ELD is an organic light emitting diode, the light emitting layer EML may include an organic material, and thus, the light emitting layer EML may be an organic light emitting layer.

When the light emitting element ELD is a quantum dot light emitting diode, the light emitting layer EML may include a quantum dot material, and thus, the light emitting layer EML may be a quantum dot light emitting layer.

A core of a quantum dot may be selected from a group II-VI compound, a group III-V compound, a group IV-VI compound, a group IV element, a group IV compound, and combinations thereof. The quantum dot may have a full width of half maximum (FWHM) of an emission wavelength spectrum of about 45 nm or less, about 40 nm or less, or about 30 nm or less. In this range, color purity or color reproducibility may be improved. In addition, since light emitted through the quantum dot is emitted in all directions, a wide viewing angle may be provided.

The quantum dot may be in a form generally known in the art. For example, the quantum dot may be in the form of a spherical, pyramidal, multi-arm, or cubic nanoparticle, nanotube, nanowire, nanofiber, or plate-like nanoparticle.

The quantum dot may control the color of emitted light according to the particle size. Therefore, the quantum dot can have various emission colors, such as blue, red, and green.

In the illustrated exemplary embodiment, the patterned light emitting layer EML is exemplarily illustrated. However, the inventive concepts are not limited thereto, and in some exemplary embodiments, the light emitting layer FAIL may be formed in common to each of the pixels PX. The light emitting layer EML may generate white light. In addition, the light emitting layer EML may have a multilayer structure called a tandem.

An electron control layer ECL is disposed on the light emitting layer EML. In some exemplary embodiments, the electron control layer ECL may be formed in common to each of the pixels PX.

A cathode CE is disposed on the electron control layer ECL. The cathode CE may be formed in common to each of the pixels PX.

The thin-film encapsulation layer TFE may be disposed on the cathode CE. The thin-film encapsulation layer TFE may include the first inorganic layer IOL1, the organic layer OL, and the second inorganic layer IOL2. The touch sensor TSL described above may be disposed on the thin-film encapsulation layer TFE.

The anode AE, the hole control layer HCL, the light emitting layer EML, the electron control layer ECL, and the cathode CE disposed in the light emitting area PXA may form the light emitting element ELD.

More particularly, the light emitting element ELD may be defined as a portion where each of the anode AE, the hole control layer HCL, the light emitting layer EML, the electron control layer ECL, and the cathode CE are located in the light emitting area PXA.

Figure 9:
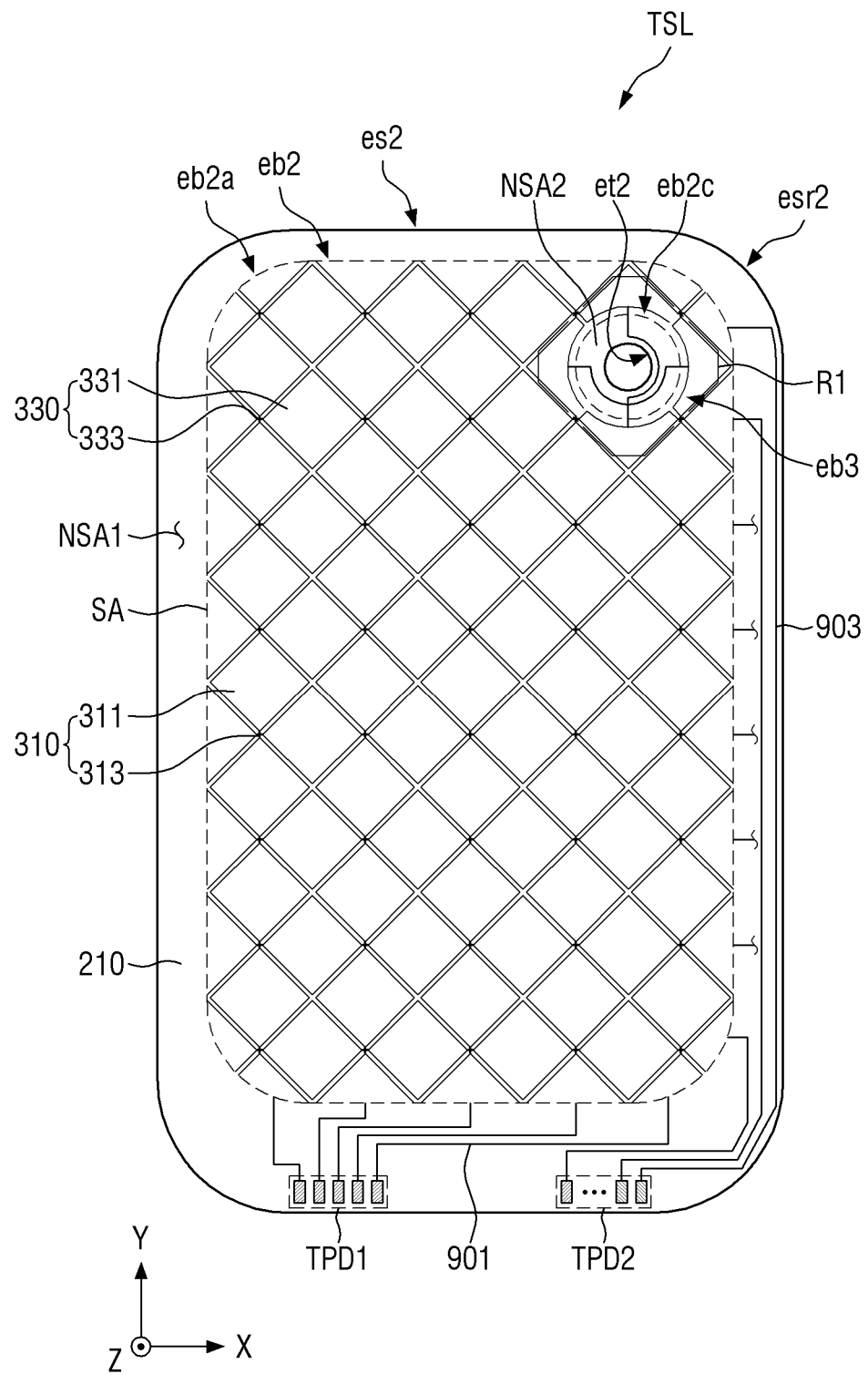
FIG. 9 is a schematic plan view of a touch sensor included in a display device according to an exemplary embodiment.
Figure 10:
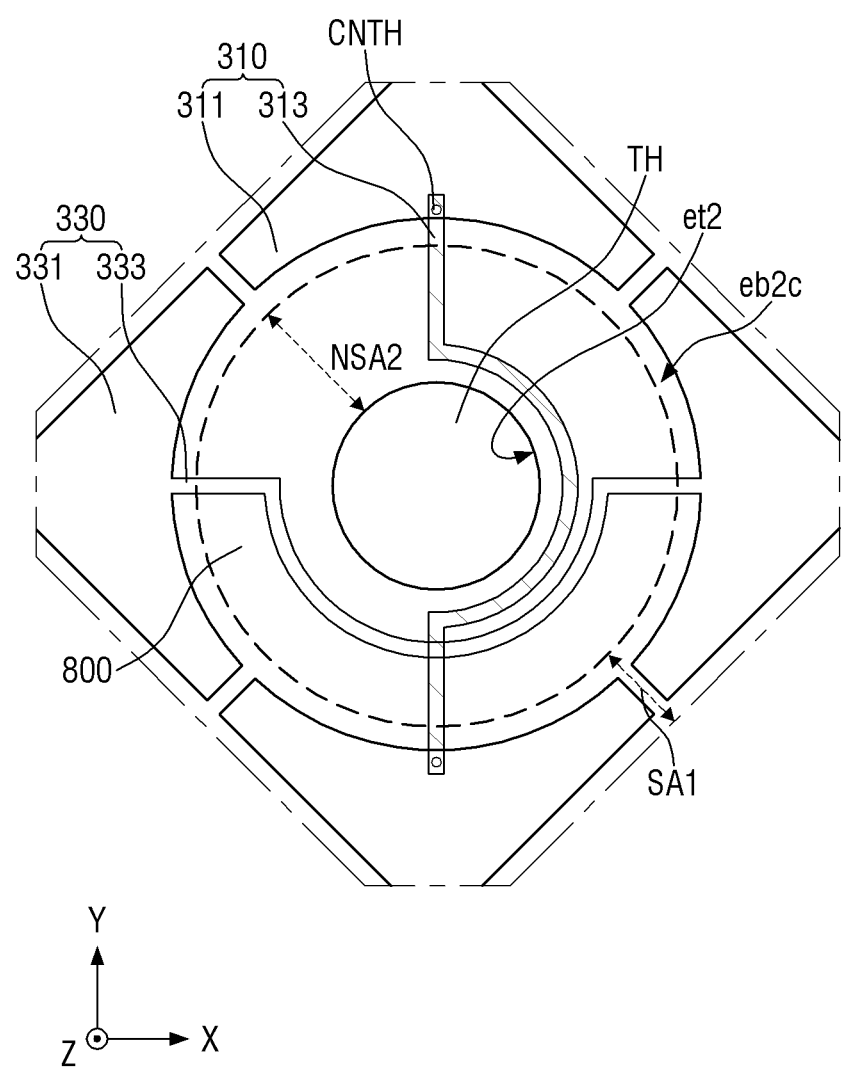
FIG. 10 is an enlarged plan view of a portion R1 of FIG. 9.

FIG. 9 is a schematic plan view of a touch sensor TSL included in a display device according to an exemplary embodiment. FIG. 10 is an enlarged plan view of a portion R1 of FIG. 9.

Referring to FIGS. 9 and 10, the touch sensor TSL is disposed on the thin-film encapsulation layer TFE. In particular, the thin-film encapsulation layer TFE may function as a base layer of the touch sensor TSL.

As in the first substrate 110, an edge "es2" of the thin-film encapsulation layer TFE may include rounded portions "esr2" at corners. In addition, the thin-film encapsulation layer TFE may further include a hole edge "et2" located around the through hole TH to define the through hole TH.

The edge "es2" of the thin-film encapsulation layer TFE and the edge "es1" of the first substrate 110 may be substantially aligned along the third direction (e.g., z-direction), and the hole edge "et2" of the thin-film encapsulation layer TFE and the hole edge "et1" of the first substrate 110 may be substantially aligned along the third direction (e.g., z-direction).

A sensing area SA, a non-sensing area NSA1, and a hole non-sensing area NSA2 are defined in the touch sensor TSL. The sensing area SA may be an area that senses a touch input in the touch sensor TSL, and the non-sensing area NSA1 and the hole non-sensing area NSA2 may be areas that may not sense a touch input.

The sensing area SA may correspond to the display area D-DA of the display device 1 illustrated in FIG. 1, or the display area DA of the display panel DP illustrated in FIG. 6. The non-sensing area NSA1 may correspond to the peripheral area D-NDA1 of the display device 1 illustrated in FIG. 1, or the peripheral area NDA1 of the display panel DP illustrated in FIG. 6. In addition, the hole non-sensing area NSA2 may correspond to the hole peripheral area D-NDA2 of the display device 1 illustrated in FIG. 1, or the hole peripheral area NDA2 of the display panel DP illustrated in FIG. 6.

A boundary "eb2" between the sensing area SA and the non-sensing area NSA1 may include rounded portions "eb2a" at corners. In addition, a boundary "eb2c" between the sensing area SA and the hole non-sensing area NSA2 may include a rounded portion, which may generally have substantially the same as the planar shape of the through hole TH, such as a circular shape.

In some exemplary embodiments, the boundary "eb2" between the sensing area SA and the non-sensing area NSA1, and the boundary "eb1" between the display area DA and the peripheral area NDA1 of the display panel DP may be substantially aligned along the third direction (e.g., z-direction). In addition, the boundary "eb2c" between the sensing area SA and the hole non-sensing area NSA2 may be substantially aligned with the boundary "eb1c" between the display area DA and the hole peripheral area NDA2 of the display panel DP along the third direction (e.g., z-direction).

The touch sensor TSL may include first electrode portions 310 and second electrode portions 330. In addition, the touch sensor TSL may further include touch signal lines 901 and 903 and touch pad portions TPD1 and TPD2.

The first electrode portions 310 and the second electrode portions 330 may be disposed in the sensing area SA, and the touch pad portions TPD1 and TPD2 and the touch signal lines 901 and 903 may be disposed in the non-sensing area NSA1. A first connection portion 313 and a second connection portion 333 around the through hole TH may be disposed in the hole non-sensing area NSA2.

Two second touch electrodes 331 spaced apart from each other along the first direction (e.g., x-direction) with the through hole TH interposed therebetween in the hole non-sensing area NSA2 may be connected to each other by the second connection portion 333 bypassing the through hole TH. In addition, two first touch electrodes 311 spaced apart from each other along the second direction (e.g., y-direction) with the through hole TH interposed therebetween in the hole non-sensing area NSA2 may be connected to each other by the first connection portion 313 bypassing the through hole TH.

Since the first connection portion 313 and the first touch electrodes 311 are disposed on different layers, the first touch electrodes 311 may be connected to the first connection portion 313 through contact holes CNTH formed in the insulating layer IL.

Hereinafter, refractors TC formed in the first inorganic layer IOL1 and/or the second inorganic layer IOL2 will be described.

Figure 11:
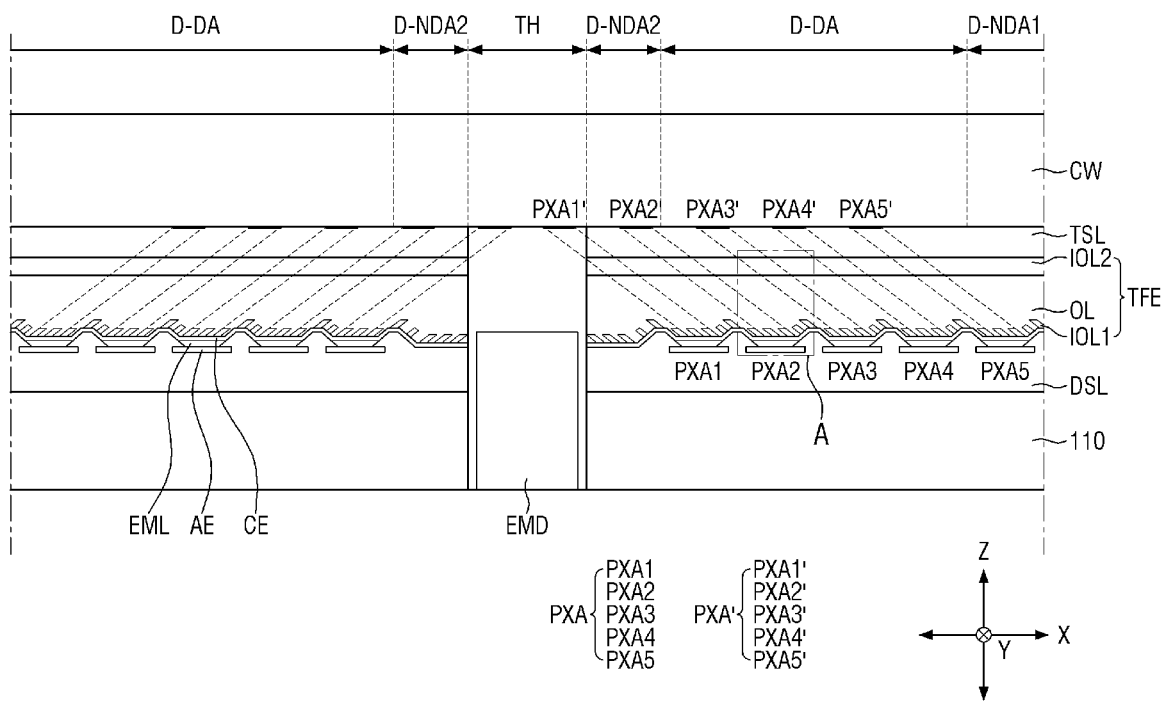
FIG. 11 is an enlarged cross-sectional view of an element layer and a thin-film encapsulation layer illustrated in FIG. 3 according to an exemplary embodiment.
Figure 12:
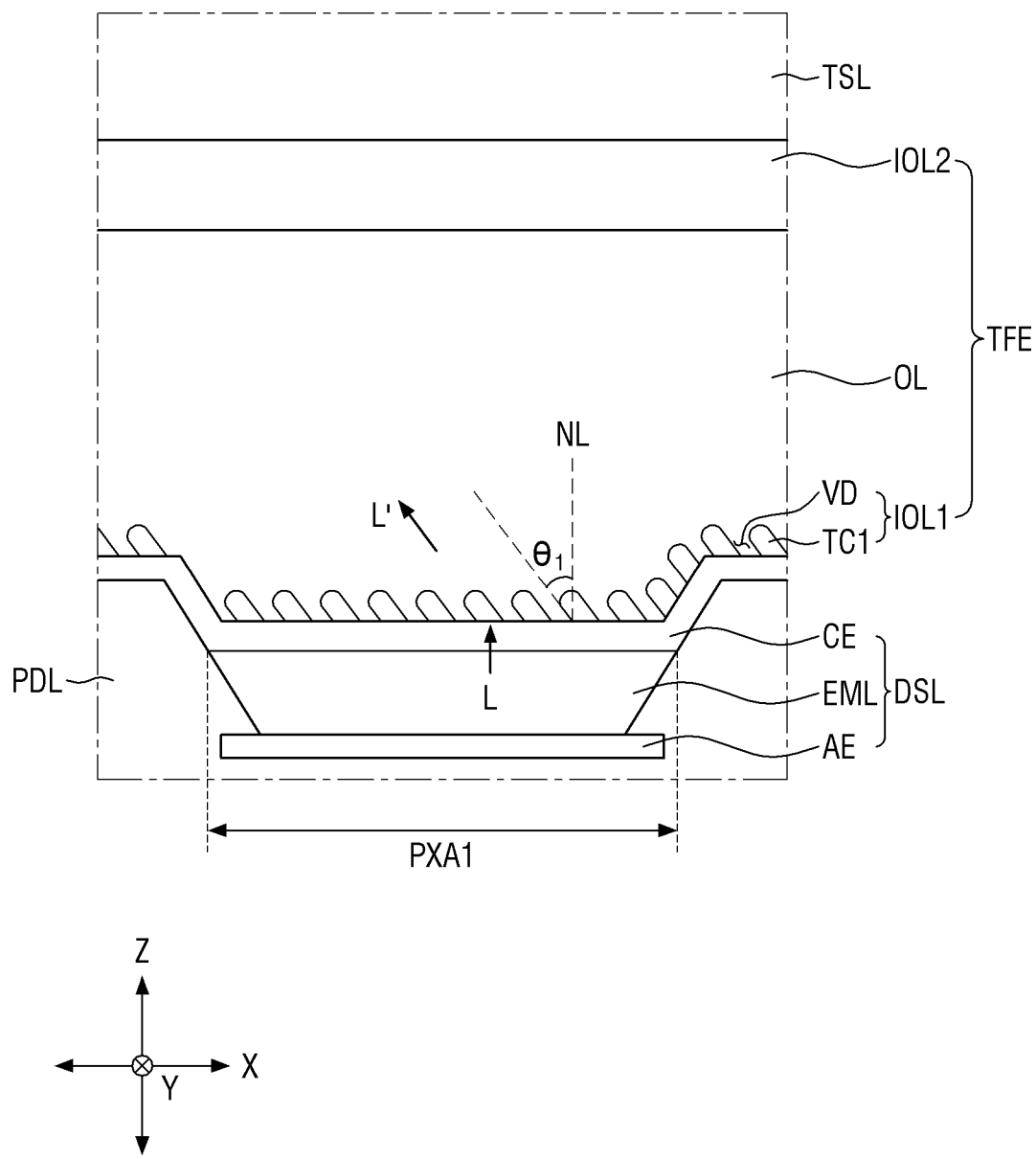
FIG. 12 is an enlarged view of an area A of FIG. 11 according to an exemplary embodiment.

FIG. 11 is an enlarged cross-sectional view of the element layer DSL and the thin-film encapsulation layer TFE illustrated in FIG. 3 according to an exemplary embodiment. FIG. 12 is an enlarged view of an area A of FIG. 11 according to an exemplary embodiment.

Referring to FIGS. 11 and 12, the element layer DSL disposed on the first substrate 110 may include the anodes AE, the light emitting layer EML, and the cathode CE. The thin-film encapsulation layer TFE may be disposed on the cathode CE. The touch sensor TSL may be disposed on the thin-film encapsulation layer TFE. The electronic element EMD may be disposed in the through hole TH passing through the first substrate 110, the element layer DSL, the thin-film encapsulation layer TFE, and the touch sensor TSL in the third direction (e.g., z-direction). The cover window CW may be disposed on the touch sensor TSL. Since the cover window CW is also disposed over the through hole TH, the cover window CW can prevent the electronic element EMD from being exposed to the outside.

The display area D-DA excluding the through hole TH may be an area, in which an image is displayed, and the peripheral area D-NDA1 and the hole peripheral area D-NDA2 may be areas, in most of which an image may not be displayed. Since the through hole TH and the hole peripheral area D-NDA2 are non-light emitting areas, where no image is displayed, the through hole TH and the hole peripheral area D-NDA2 may be recognized as dark spots or defects, when seen from the front. If the path of light emitted from light emitting areas PXA adjacent to the through hole TH and the hole peripheral area D-NDA2 is changed, virtual light emitting areas PXA' may be formed in the through hole TH and the hole peripheral area D-NDA2.

The thin-film encapsulation layer TFE may include the first inorganic layer IOL1, the organic layer OL, and the second inorganic layer IOL2. The first inorganic layer IOL1 may prevent permeation of foreign matter, such as moisture ($H_2O$) or oxygen ($O_2$), and may include a first inorganic material. For example, the first inorganic material may include one or more of $AlO_x$, $TiO_2$, ZrO, $SiO_2$, AlON, SiON, ZnO, and $Ta_2O_5$, without being limited thereto.

The first inorganic layer IOL1 may include first refractors TC1 inclined at a predetermined angle. For example, the first refractors TC1 may have substantially an elongated shape, such as cylindrical bars, which may be inclined at a first inclination angle θ1 with respect to an imaginary line NL substantially perpendicular to the cathode CE. The imaginary line NL substantially perpendicular to the cathode CE may coincide with the third direction (e.g., z-direction). The first refractors TC1 may include an inorganic material. The first inorganic layer IOL1 including the first refractors TC1 having three-dimensional (3D) bar shape may include voids VD therebetween.

Light L emitted from a first light emitting area PXA1 travels mostly in the third direction (e.g., z-direction). However, when the first refractors TC1 are formed on the first light emitting area PXA1 according to the illustrated exemplary embodiment, light L' passing through the first refractors TC1 may travel mostly in a direction inclined at the first inclination angle θ1 with respect to the imaginary line NL substantially perpendicular to the cathode CE.

For example, as illustrated in FIG. 11, light emitted from the first light emitting area PXA1 may travel to an area overlapping the through hole TH and form a first virtual light emitting area PXA1', and light emitted from a second light emitting area PXA2 may travel to an area overlapping the hole peripheral area D-NDA2 and form a second virtual light emitting area PXA2'.

In addition, light emitted from a third light emitting area PXA3 and a fourth light emitting area PXA4 may move a predetermined distance in the first direction (e.g., x-direction) when passing through the first refractors TC1 to form a third virtual light emitting area PXA3' and a fourth virtual light emitting area PXA4', respectively. In particular, the third virtual light emitting area PXA3' and the fourth virtual light emitting area PXA4' may be formed in the display area D-DA.

Light emitted from a fifth light emitting area PXA5 disposed in the peripheral area D-NDA1 may move a predetermined distance in the first direction (e.g., x-direction) when passing through the first refractors TC1 to form a fifth virtual light emitting area PXA5'. In some exemplary embodiments, although the fifth light emitting area PXA5 disposed in the peripheral area D-NDA1 is a light emitting area, the fifth light emitting area PXA5 can be recognized as a non-light emitting area as not being visible due to a pattern printed on the cover window CW.

The first inclination angle θ1 of the first refractors TC1 may be adjusted by controlling source injection direction and rate, deposition direction, or the like, during a manufacturing process according to oblique angle deposition or glancing angle deposition, which will be described in more detail later. As the first inclination angle θ1 increases, the path of light passing through the first refractors TC1 may be changed to the greater extent. For example, when the through hole TH, in which the electronic element EMD is disposed, and the hole peripheral area D-NDA2 are increased in size, the first inclination angle θ1 may be designed to be greater so as to form wider virtual light emitting areas PXA'.

The organic layer OL may be disposed directly on the first inorganic layer IOL1 including the first refractors TC1. The organic layer OL may include a polymer-based organic material. The polymer-based material may include acrylic resin, epoxy resin, polyimide, and polyethylene, without being limited thereto. The organic layer OL may be formed to be thicker than the first inorganic layer IOL1 to entirely cover the first refractors TC1. A portion of the organic layer OL, for example, a lower portion of the organic layer OL may fill the voids VD between the first refractors TC1. In this manner, the adhesion between the first inorganic layer IOL1 and the organic layer OL may be increased.

The second inorganic layer IOL2 may be formed on the organic layer OL. The second inorganic layer IOL2 may prevent permeation of foreign matter, such as moisture (H2O) or oxygen (O2), and may include a second inorganic material. For example, the second inorganic material may include one or more of $AlO_x$, $TiO_2$, ZrO, $SiO_2$, AlON, SiON, ZnO, and $Ta_2O_5$, without being limited thereto.

Hereafter, other exemplary embodiments will be described. Hereinafter, a description of elements substantially identical to those of the above-described exemplary embodiments will be omitted or given briefly to avoid redundancy. As such, the following exemplary embodiments will be described, focusing mainly on differences from the above-described exemplary embodiments.

Figure 13:
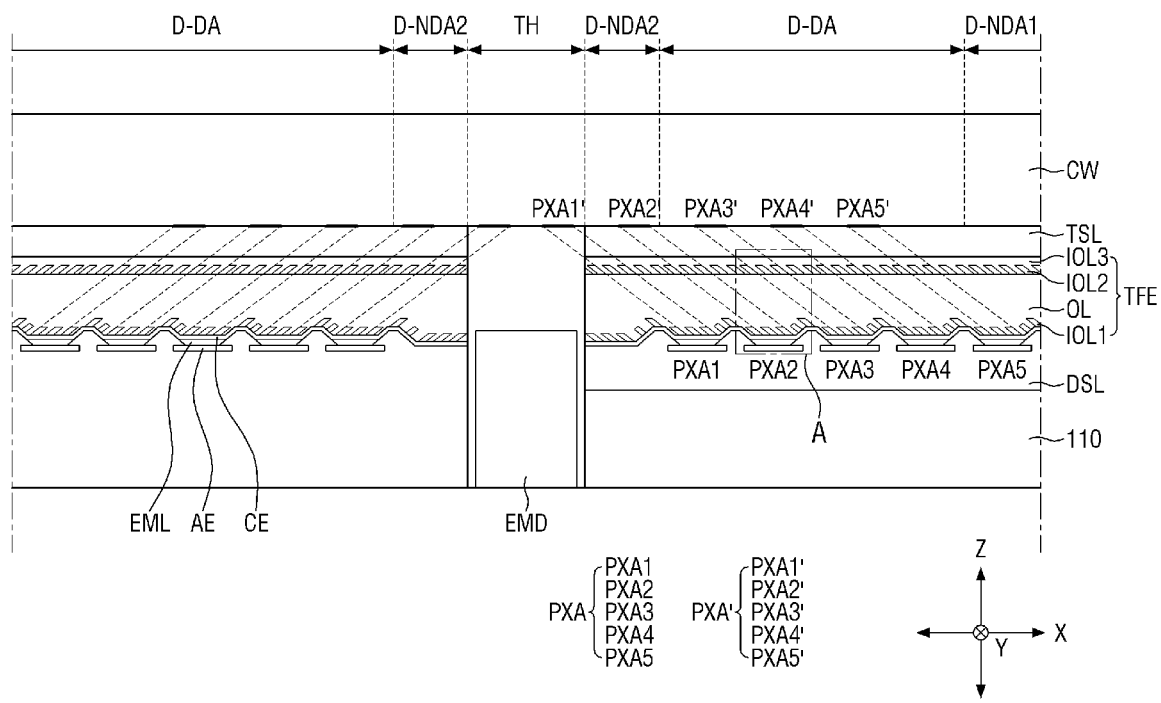
FIG. 13 is an enlarged cross-sectional view of the element layer and the thin-film encapsulation layer illustrated in FIG. 3 according to an exemplary embodiment.
Figure 14:
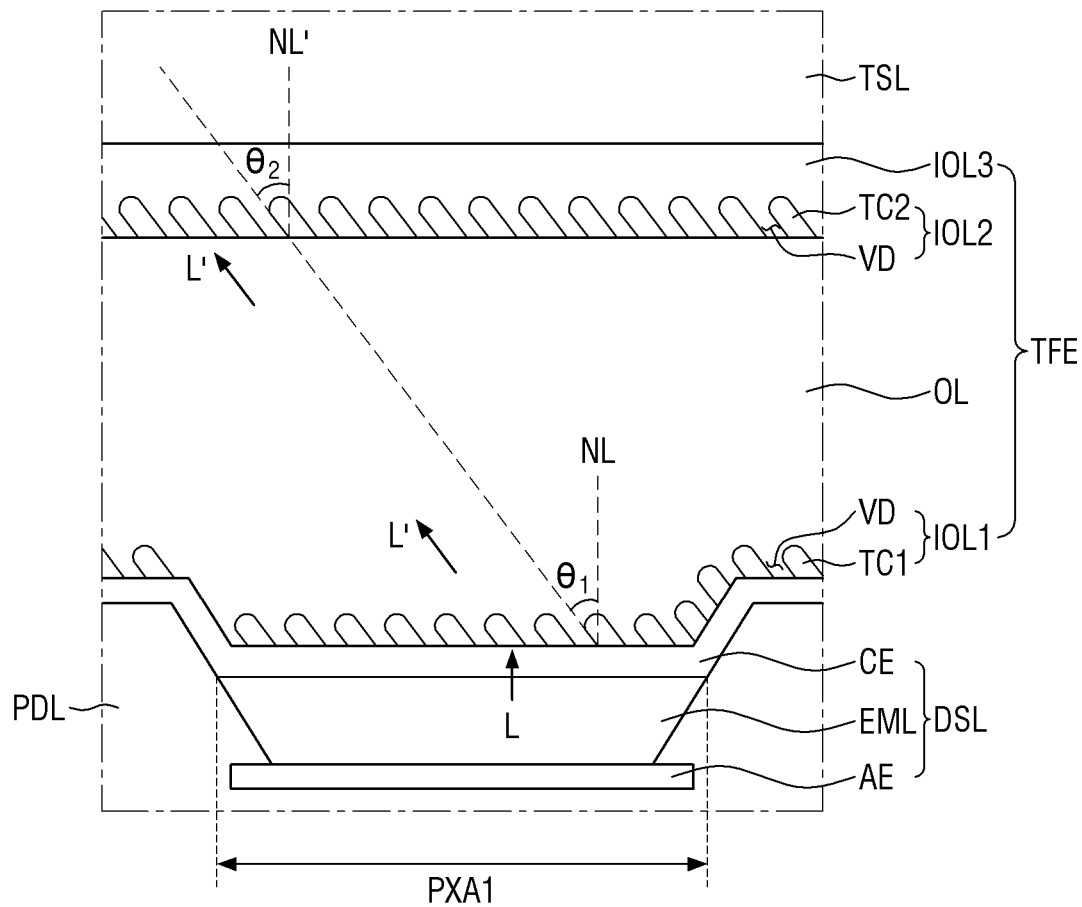
FIG. 14 is an enlarged view of an area A of FIG. 13 according to an exemplary embodiment.
Figure 14:
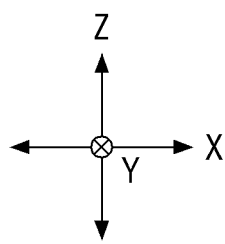

FIG. 13 is an enlarged cross-sectional view of the element layer DSL and the thin-film encapsulation layer TFE illustrated in FIG. 3 according to an exemplary embodiment. FIG. 14 is an enlarged view of an area A of FIG. 13 according to an exemplary embodiment.

Referring to FIGS. 13 and 14, the element layer DSL and the thin-film encapsulation layer TFE according to the illustrated exemplary are different from those of FIGS. 11 and 12, in that second refractors TC2 are further included in a second inorganic layer IOL2 and that a third inorganic layer IOL3 is further provided to cover the second refractors TC2.

More specifically, the second inorganic layer IOL2 may be formed on an organic layer OL. The second inorganic layer IOL2 may include the second refractors TC2 inclined at a predetermined angle. For example, the second refractors TC2 may have substantially an elongated shape, such as cylindrical bars, which may be inclined at a second inclination angle θ2 with respect to an imaginary line NL' substantially perpendicular to the organic layer OL. The imaginary line NL' substantially perpendicular to the organic layer OL may coincide with the third direction (e.g., z-direction). According to an exemplary embodiment, the second inclination angle θ2 may be the same as a first inclination angle θ1. The second refractors TC2 may include a second inorganic material. For example, the second inorganic material may include one or more of $AlO_x$, $TiO_2$, ZrO, $SiO_2$, AlON, SiON, ZnO, and $Ta_2O_5$, without being limited thereto. The second inorganic layer IOL2 including the second refractors TC2 having 3D bar shape may include voids VD therebetween.

The third inorganic layer IOL3 may be disposed directly on the second inorganic layer IOL2 including the second refractors TC2. The third inorganic layer IOL3 may prevent permeation of foreign matter, such as moisture ($H_2O$) or oxygen ($O_2$), and may include a third inorganic material. For example, the third inorganic material may include one or more of $AlO_x$, $TiO_2$, ZrO, $SiO_2$, AlON, SiON, ZnO, and $Ta_2O_5$, without being limited thereto. The third inorganic layer IOL3 may be formed to be thicker than the second inorganic layer IOL2 to entirely cover the second refractors TC2. A portion of the third inorganic layer IOL3, for example, a lower portion of the third inorganic layer IOL3 may fill the voids VD provided between the second refractors TC2. In this manner, irregularities formed in the second inorganic layer IOL2 may be substantially flattened (or planarized). The touch sensor TSL described above may be formed on the third inorganic layer IOL3.

When a plurality of first refractors TC1 are formed on a first light emitting area PXA1, light L' passing through the first refractors TC1 may travel mostly in a direction inclined at the first inclination angle θ1 with respect to an imaginary line NL substantially perpendicular to a cathode CE. However, some of the light L' passing through the first refractors TC1 may be scattered while passing through the organic layer OL, or its path may be changed due to a difference in refractive index at the very moment when light passes through a boundary between the organic layer OL and the third inorganic layer IOL3.

As such, the second refractors TC2 are formed in the second inorganic layer IOL2 according to the illustrated exemplary embodiment, such that light L' incident on the second inorganic layer IOL2 may travel in a direction inclined at the second inclination angle θ2 with respect to the imaginary line NL' substantially perpendicular to the organic layer OL. More particularly, light L' incident on the second inorganic layer IOL2 may travel in the same path as the direction inclined at the first inclination angle 10 with respect to the imaginary line NL substantially perpendicular to the cathode CE. In this manner, virtual light emitting areas PXA' can be formed more clearly in an area overlapping a through hole TH and an area overlapping a hole peripheral area D-NDA2.

For example, as illustrated in FIG. 13, light emitted from the first light emitting area PXA1 may travel to the area overlapping the through hole TH when passing through the first refractors TC1 and the second refractors TC2 and form a first virtual light emitting area PXA1', and light emitted from a second light emitting area PXA2 may travel to the area overlapping the hole peripheral area D-NDA2 and form a second virtual light emitting area PXA2'.

In addition, light emitted from a third light emitting area PXA3 and a fourth light emitting area PXA4 may move a predetermined distance in the first direction (e.g., x-direction) when passing through the first refractors TC1 and the second refractors TC2, and form a third virtual light emitting area PXA3' and a fourth virtual light emitting area PXA4', respectively. More particularly, the third virtual light emitting area PXA3' and the fourth virtual light emitting area PXA4' may be formed in a display area D-DA.

Light emitted from a fifth light emitting area PXA5 disposed in a peripheral area D-NDA1 may move a predetermined distance in the first direction (e.g., x-direction) when passing through the first refractors TC1 and the second refractors TC2, and form a fifth virtual light emitting area PXA5' in the display area D-DA. In some exemplary embodiments, although the fifth light emitting area PXA5 disposed in the peripheral area D-NDA1 is a light emitting area, the fifth light emitting area PXA5 can be recognized as a non-light emitting area as not being visible due to a pattern printed on the cover window CW.

The first inclination angle θ1 of the first refractors TC1 and the second inclination angle θ2 of the second refractors TC2 may be adjusted by controlling source injection direction and rate, deposition direction, or the like during a manufacturing process according to oblique angle deposition or glancing angle deposition, which will be described in more detail later. As the first inclination angle θ1 of the first refractors TC1 and the second inclination angle θ2 of the second refractors TC2 increase, the path of light passing through the first refractors TC1 and the second refractors TC2 may be changed to the greater extent. For example, when the through hole TH, in which an electronic element EMD is disposed, and the hole peripheral area D-NDA2 are increased in size, the first inclination angle θ1 and the second inclination angle θ2 may be designed to be greater so as to form wider virtual light emitting areas PXA'.

Figure 15:
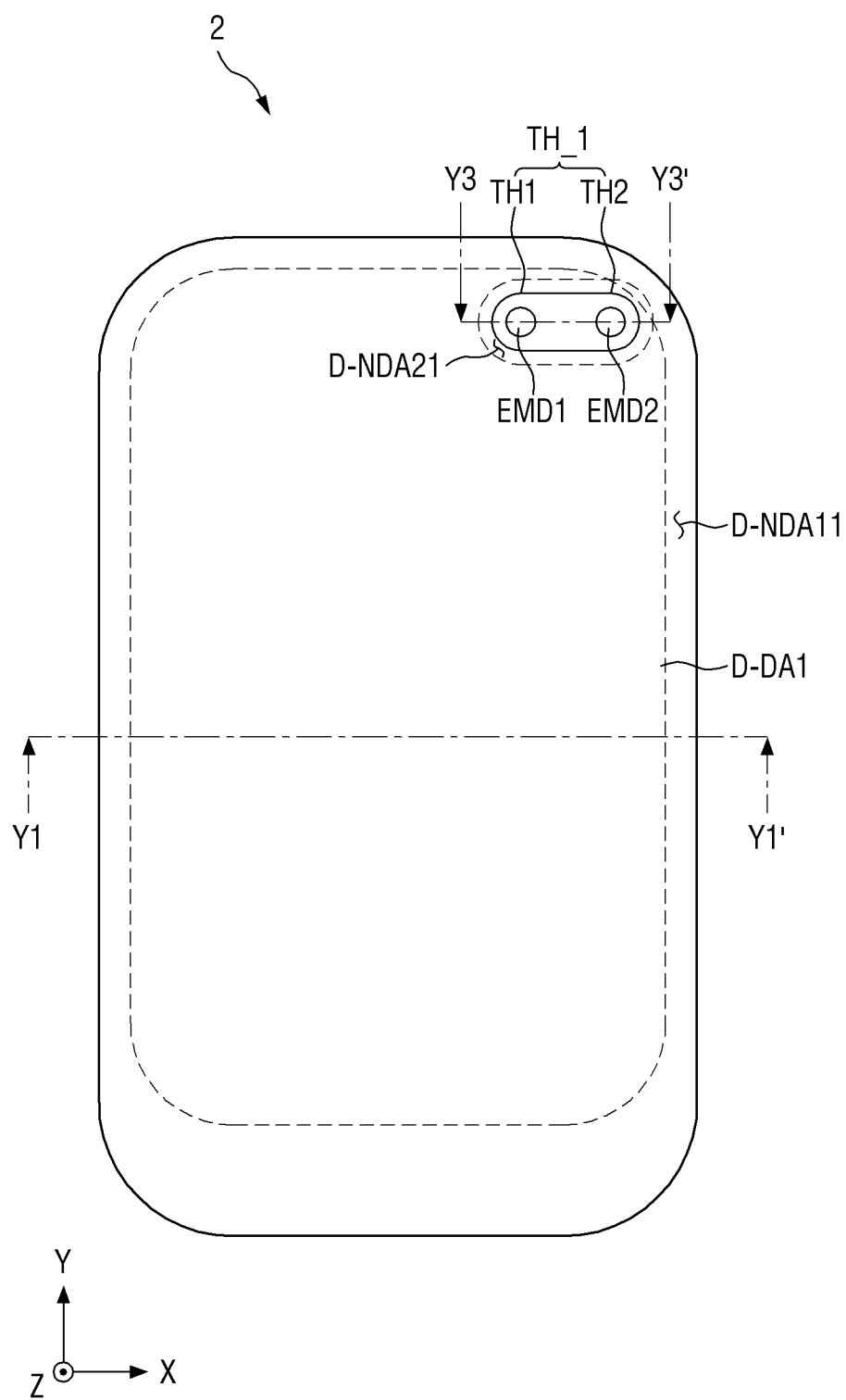
FIG. 15 is a schematic plan view of a display device according to an exemplary embodiment.
Figure 16:
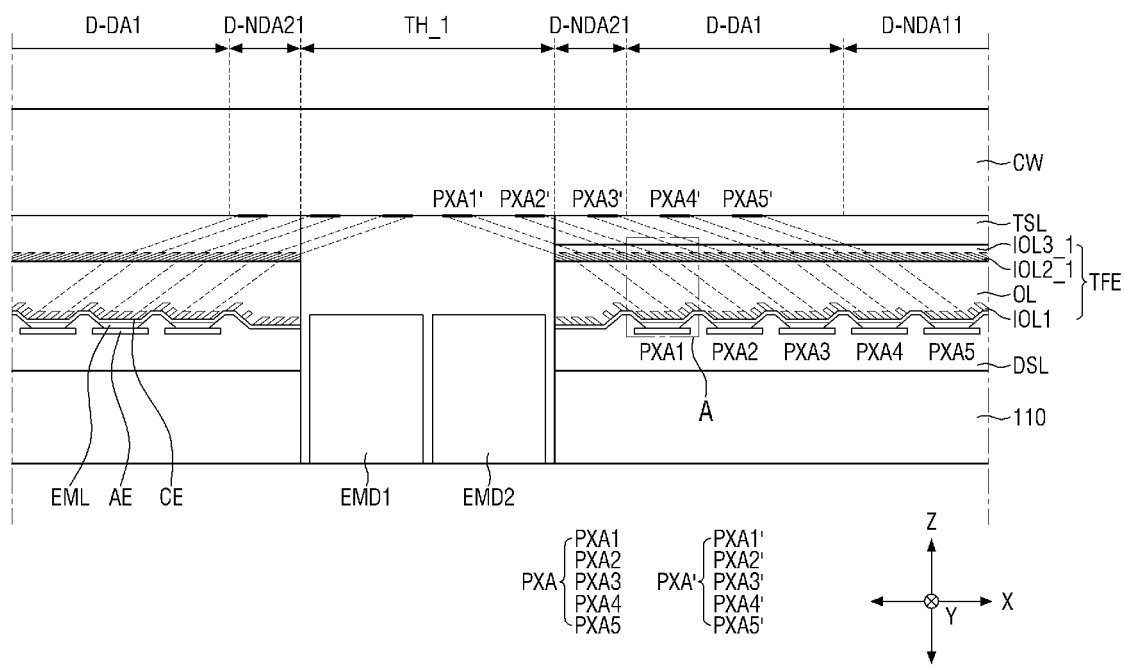
FIG. 16 is an enlarged cross-sectional view of the element layer and the thin-film encapsulation layer illustrated in FIG. 3 according to an exemplary embodiment.
Figure 17:
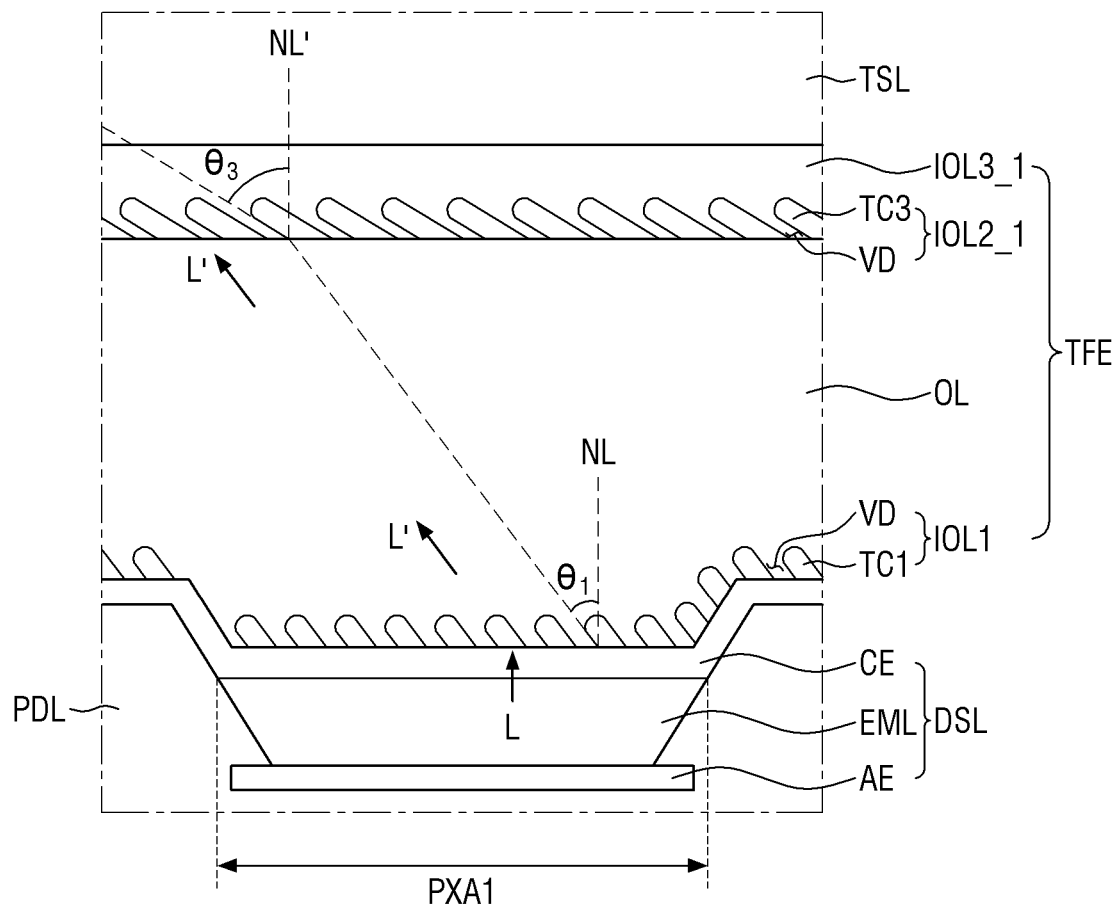
FIG. 17 is an enlarged view of an area A of FIG. 16 according to an exemplary embodiment.
Figure 17:
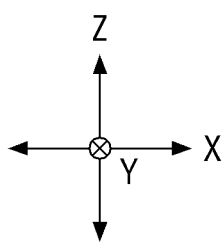

FIG. 15 is a schematic plan view of a display device according to an exemplary embodiment. FIG. 16 is an enlarged cross-sectional view of the element layer DSL and the thin-film encapsulation layer TFE illustrated in FIG. 15 according to an exemplary embodiment. FIG. 17 is an enlarged view of an area A of FIG. 16 according to an exemplary embodiment.

Referring to FIGS. 15 through 17, the display device 2 according to the illustrated exemplary embodiment is different from that of FIGS. 13 and 14, in that a through hole TH_1 having a first electronic element EMD1 and a second electronic element EMD2 is included in a display area D-DA1, and that third refractors TC3 included in a second inorganic layer IOL2_1 have a third inclination angle θ3 greater than a first inclination angle θ1 and a second inclination angle θ2.

More specifically, the second inorganic layer IOL2_1 may be formed on an organic layer OL. The second inorganic layer IOL2_1 may include the third refractors TC3 inclined at a predetermined angle. For example, the third refractors TC3 may have substantially an elongated shape, such as cylindrical bars, which may be inclined at the third inclination angle θ3 with respect to an imaginary line NL' substantially perpendicular to the organic layer OL. The imaginary line NL' substantially perpendicular to the organic layer OL may coincide with the third direction (e.g., z-direction). According to an exemplary embodiment, the third inclination angle θ3 may be different from the first inclination angle θ1. The third refractors TC3 may include a third inorganic material. For example, the third inorganic material may include one or more of $AlO_x$, $TiO_2$, ZrO, $SiO_2$, AlON, SiON, ZnO, and $Ta_2O_5$, without being limited thereto. The second inorganic layer IOL2_1 including the third refractors TC3 having 3D bar shape may include voids VD therebetween.

When the third refractors TC3 are formed in the second inorganic layer IOL2_1, light L' incident on the second inorganic layer IOL2_1 may travel in a direction inclined at the third inclination angle θ3 with respect to the imaginary line NL' substantially perpendicular to the organic layer OL. More particularly, light L' incident on the second inorganic layer IOL2_1 may travel in a different path from a direction inclined at the first inclination angle θ1 with respect to an imaginary line NL substantially perpendicular to a cathode CE. According to an exemplary embodiment, the third inclination angle θ3 may be greater than the first inclination angle θ1. In this case, light L' incident on the second inorganic layer IOL2_1 may be refracted to the greater extent than light L incident on a first inorganic layer IOL1.

As such, wider virtual light emitting areas PXA' can be formed in an area overlapping the through hole TH_1 and an area overlapping a hole peripheral area D-NDA21.

For example, as illustrated in FIG. 16, light emitted from a first light emitting area PXA1 and a second light emitting area PXA2 may travel to the area overlapping the through hole TH_1 when passing through first refractors TC1 and the third refractors TC3 and form a first virtual light emitting area PXA1' and a second virtual light emitting area PXA2'. Light emitted from a third light emitting area PXA3 may travel to the area overlapping the hole peripheral area D-NDA21 and form a third virtual light emitting area PXA3'.

In addition, light emitted from a fourth light emitting area PXA4 may move a predetermined distance in the first direction (e.g., x-direction) when passing through the first refractors TC1 and the third refractors TC3 and form a fourth virtual light emitting area PXA4'. In particular, the fourth virtual light emitting area PXA4' may be formed in the display area D-DA1.

Light emitted from a fifth light emitting area PXA5 disposed in a peripheral area D-DNA11 may move a predetermined distance in the first direction (e.g., x-direction) when passing through the first refractors TC1 and the third refractors TC3 and form a fifth virtual light emitting area PXA5' in the display area D-DA1. In some exemplary embodiments, although the fifth light emitting area PXA5 disposed in the peripheral area D-DNA11 is a light emitting area, the fifth light emitting area PXA5 can be recognized as a non-light emitting area as not being visible due to a pattern printed on a cover window CW.

The first inclination angle θ1 of the first refractors TC1 and the third inclination angle θ3 of the third refractors TC3 may be adjusted by controlling source injection direction and rate, deposition direction, or the like during a manufacturing process according to oblique angle deposition or glancing angle deposition, which will be described later. As the first inclination angle θ1 of the first refractors TC1 and the third inclination angle θ3 of the third refractors TC3 increase, the path of light passing through the first refractors TC1 and the third refractors TC3 may be changed to the greater extent. For example, when the through hole TH_1, in which the first electronic element EMD1 and the second electronic element EMD2 are disposed, and the hole peripheral area D-NDA21 are increased in size, the first inclination angle θ1 and the third inclination angle θ3 may be designed to be greater so as to form wider virtual light emitting areas PXA'.

Figure 18:
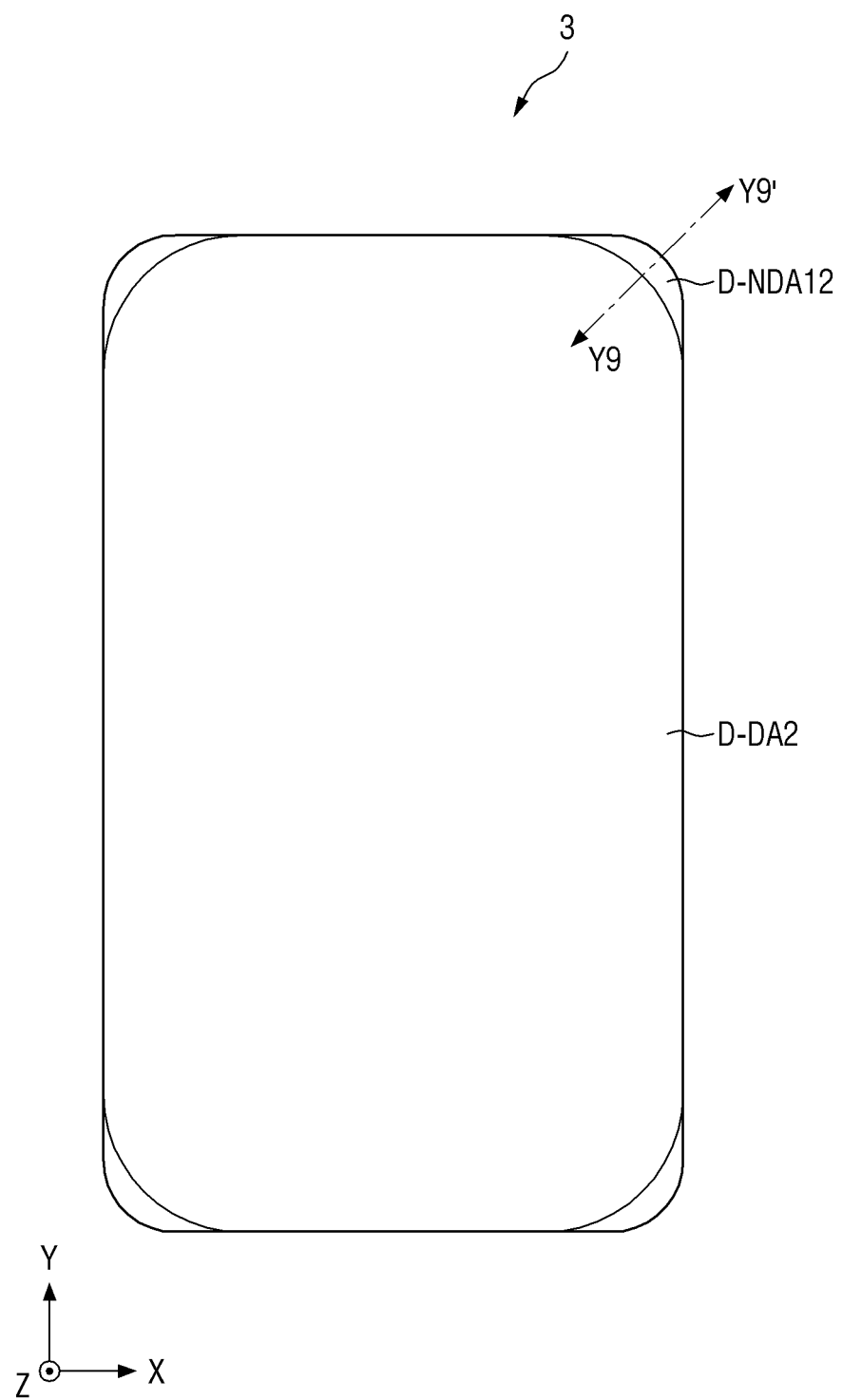
FIG. 18 is a schematic plan view of a display device according to an exemplary embodiment.
Figure 19:
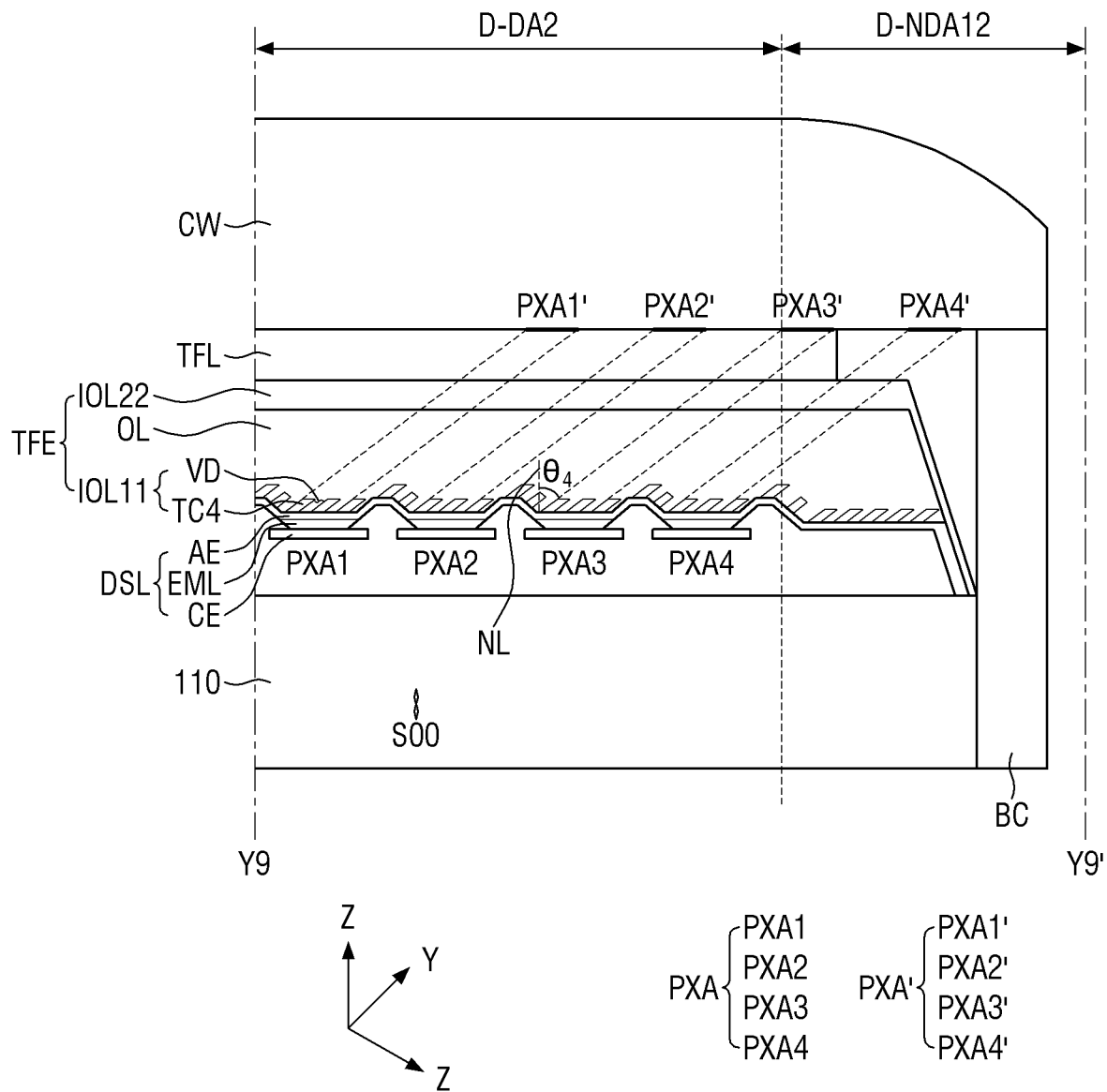
FIG. 19 is a schematic cross-sectional view taken along Y9-Y9' of the display device of FIG. 18 according to an exemplary embodiment.

FIG. 18 is a schematic plan view of a display device according to an exemplary embodiment. FIG. 19 is a schematic cross-sectional view taken along Y9-Y9' of the display device of FIG. 18 according to an exemplary embodiment.

Referring to FIGS. 18 and 19, the display device 3 is different from the display device 1 of FIG. 1, in that a peripheral area D-NDA12 is formed in only a part of each corner area, where one short side and one long side of the display device 3 meet.

More specifically, the display device 3 may include both short sides extending in the first direction (e.g., x-direction) and both long sides extending in the second direction (e.g., y-direction) intersecting the first direction. Each corner where a long side and a short side of the display device 3 meet may be curved. In some exemplary embodiments, the display device 3 may further include fourth side display areas extending and bending from both short sides and both long sides of a display area D-DA2 disposed at the front side thereof. As such, the peripheral area D-NDA12, which is a non-light emitting area, may be disposed in only a part of each corner, where a long side and a short side meet.

An element layer DSL disposed on a first substrate 110 may include anodes AE, light emitting layers EML, and a cathode CE. A thin-film encapsulation layer TFE may be disposed on the cathode CE. A touch sensor TSL may be disposed on the thin-film encapsulation layer TFE. A cover window CW may be disposed on the touch sensor TSL. The cover window CW may be supported by a bottom chassis BC. In this manner, the cover window CW may also be disposed in the peripheral area D-NDA12.

The display area D-DA2 may be an area, in which an image is displayed, and the peripheral area D-NDA12 may be an area, in most of which an image may be displayed. When the path of light emitted from a light emitting area PXA adjacent to the peripheral area D-NDA12 is changed, a virtual light emitting area PXA' may be formed in the peripheral area D-NDA12.

The thin-film encapsulation layer TFE may include a first inorganic layer IOL11, an organic layer OL, and a second inorganic layer IOL22. The first inorganic layer IOL11 may prevent permeation of foreign matter, such as moisture ($H_2O$) or oxygen ($O_2$) and may include a first inorganic material. For example, the first inorganic material may include one or more of $AlO_x$, $TiO2$, $ZrO$, $SiO2$, $AlON$, $SiON$, $ZnO$, and $Ta2O5$, without being limited thereto.

The first inorganic layer IOL11 may include fourth refractors TC4 inclined at a predetermined angle. For example, the fourth refractors TC4 may have substantially an elongated shape, such as cylindrical bars, which may be inclined at a fourth inclination angle θ4 with respect to an imaginary line NL substantially perpendicular to the cathode CE. The imaginary line NL substantially perpendicular to the cathode CE may coincide with the third direction (e.g., z-direction). The fourth refractors TC4 may include an inorganic material. The first inorganic layer IOL11 including the fourth refractors TC4 having 3D bar shape may include voids VD therebetween.

Light L emitted from a first light emitting area PXA1 travels mostly in the third direction (e.g., z-direction). However, when the fourth refractors TC4 are formed on the first light emitting area PXA1, light L' passing through the fourth refractors TC4 may travel mostly in a direction inclined at the fourth inclination angle θ4 with respect to the imaginary line NL substantially perpendicular to the cathode CE.

For example, as illustrated in FIG. 19, light emitted from the first light emitting area PXA1 and a second light emitting area PXA2 may move a predetermined distance along a direction between the first direction (e.g., x-direction) and the second direction (e.g., y-direction) when passing through the fourth refractors TC4 and form a first virtual light emitting area PXA1' and a second virtual light emitting area PXA2'. In particular, the first virtual light emitting area PXA1' and the second virtual light emitting area PXA2' may be formed in the display area D-DA2.

Light emitted from a third light emitting area PXA3 and a fourth light emitting area PXA4 may travel to an area overlapping the peripheral area D-NDA12 when passing through the fourth refractors TC4 and form a third virtual light emitting area PXA3' and a fourth virtual light emitting area PXA4'. In this manner, a non-light emitting area may be relatively reduced.

The fourth inclination angle θ4 of the fourth refractors TC4 may be adjusted by controlling source injection direction and rate, deposition direction, or the like during a manufacturing process according to oblique angle deposition or glancing angle deposition, which will be described later. As the fourth inclination angle θ4 increases, the path of light passing through the fourth refractors TC4 may be changed to the greater extent.

The organic layer OL may be disposed directly on the first inorganic layer IOL11 including the fourth refractors TC4. The organic layer OL may include a polymer-based organic material. The polymer-based material may include acrylic resin, epoxy resin, polyimide, and polyethylene, without being limited thereto. The organic layer OL may be formed to be thicker than the first inorganic layer IOL11 to entirely cover the fourth refractors TC4. A portion of the organic layer OL, for example, a lower portion of the organic layer OL may fill the voids VD provided in the fourth refractors TC4. In this manner, the adhesion between the first inorganic layer IOL11 and the organic layer OL may be increased.

The second inorganic layer IOL22 may be formed on the organic layer OL. The second inorganic layer IOL22 may prevent permeation of foreign, matter such as moisture (H2O) or oxygen (O2) and may include a second inorganic material. For example, the second inorganic material may include one or more of $AlO_x$, $TiO_2$, ZrO, $SiO_2$, AlON, SiON, ZnO, and $Ta_2O_5$, without being limited thereto. In some exemplary embodiments, the second inorganic layer IOL22 may further include refractors, and the path of light incident on the second inorganic layer IOL22 may be controlled by adjusting an inclination angle of the refractors.

A method of forming refractors on a cathode CE will now be described.

Figure 20:
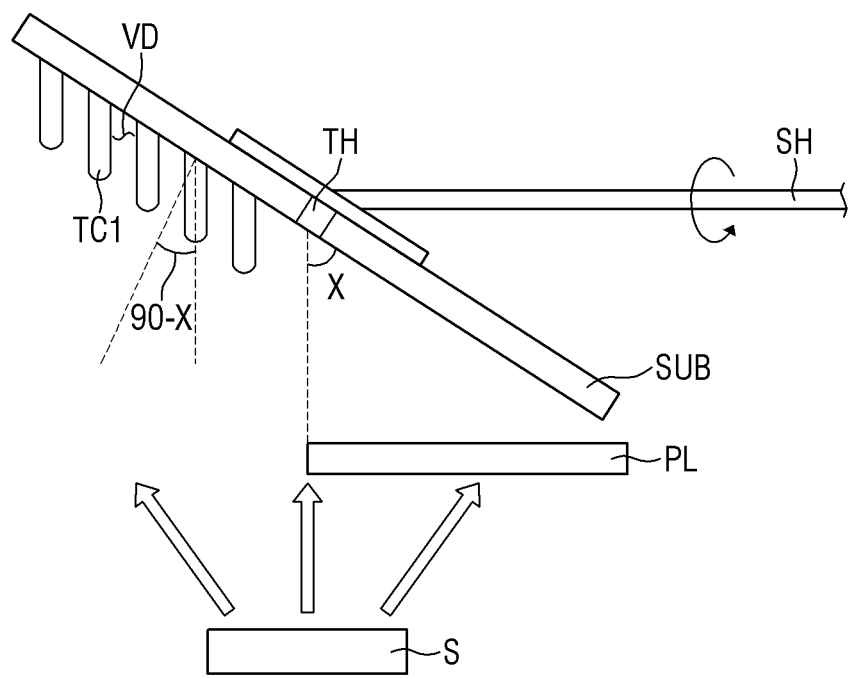
FIGS. 20 and 21 are diagrams illustrating a method of forming refractors using oblique angle deposition or glancing angle deposition.
Figure 21:
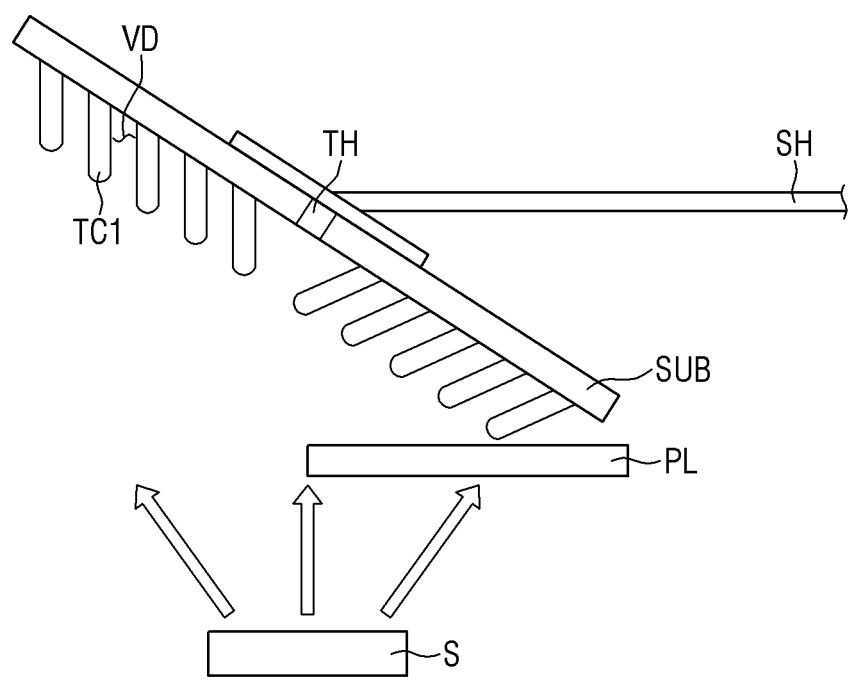

FIGS. 20 and 21 are diagrams illustrating a method of forming refractors using oblique angle deposition or glancing angle deposition.

Referring to FIGS. 13, 14, 20 and 21, a substrate SUB may be fixed to a substrate holder SH. The substrate SUB may be in a state where an element layer DSL is disposed on a first substrate 110. The element layer DSL may be in a state where anodes AE, light emitting layers EML, and a cathode CE are stacked sequentially. The substrate SUB may be inclined at a predetermined angle with respect to a surface from which a source S is to be emitted. For example, when an angle formed by an imaginary line substantially perpendicular to the surface from which the source S is to be emitted, and an upper surface of the substrate SUB is inclined at X degrees, a first inclination angle θ1 may be 90-X degrees. The source S may include one or more inorganic materials selected from $AlO_x$, $TiO_2$, ZrO, $SiO_2$, AlON, SiON, ZnO, and $Ta_2O_5$, without being limited thereto In oblique angle deposition or glancing angle deposition, a film is generally formed by rotating the substrate SUB. In the case of the rotating film formation, first refractors TC1 may have a 3D nanostructure having at least one pitch around one axis. For example, as an inorganic material grows clockwise or counterclockwise around one axis, columnar or spherical helical refractors may be formed.

In the illustrated exemplary embodiment, a film may be formed by keeping the substrate SUB fixed at a predetermined angle without rotating the substrate SUB. In the case of the fixed film formation, the first refractors TC1 may have a 3D nanostructure having a first directionality. For example, the first refractors TC1 may have substantially an elongated shape, such as cylindrical bars, which may be inclined at the first inclination angle θ1 with respect to an imaginary line NL substantially perpendicular to the cathode CE.

To form a film by fixing the substrate SUB, an end of an anti-deposition plate PL may be aligned with an area, in which a through hole TH is disposed. The first refractors TC1 may not be formed on the substrate SUB in an area overlapping the anti-deposition plate PL. After the first refractors TC1 having the first directionality are formed, the substrate hole SH may be rotated 180 degrees.

If the fixed film formation process is repeated after the substrate hole SH is rotated 180 degrees, first refractors TC1 having a second directionality may be formed. Although the first refractors TC1 are described as having two directionalities, however, the inventive concepts are not limited thereto. For example, in some exemplary embodiments, the first refractors TC1 having a plurality of directionalities can also be formed depending on the degree to which the substrate hole SH is rotated.

According to the exemplary embodiments, a display device has an increased proportion of display area and improved display quality.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a display area and a non-display area;
    a substrate including a through hole in the display area;
    an element layer including an anode disposed on the substrate, a light emitting layer disposed on the anode, and a cathode disposed on the light emitting layer; and
    a thin-film encapsulation layer including a first inorganic layer disposed on the element layer, an organic layer disposed on the first inorganic layer, and a second inorganic layer disposed on the organic layer,
    wherein the first inorganic layer includes a plurality of first refractors having a first inclination angle.

2. The display device of claim 1, wherein the first refractors are disposed on the cathode.

3. The display device of claim 2, wherein the first inclination angle defines a degree of inclination with respect to an imaginary line substantially perpendicular to an upper surface of the cathode.

4. The display device of claim 2, wherein a path of light emitted from the light emitting layer is configured to be refracted to the greater extent as the first inclination angle increases.

5. The display device of claim 1, wherein the first inorganic layer further includes a plurality of first voids formed between the first refractors.

6. The display device of claim 5, wherein at least a portion of the first voids are filled with the organic layer.

7. The display device of claim 1, wherein the non-display area includes a hole peripheral area along a rim of the through hole.

8. The display device of claim 7, wherein:
    the non-display area further includes a peripheral area; and
    the light emitting layer has a first light emitting area and a second light emitting area disposed in the display area, and a third light emitting area disposed in the peripheral area.

9. The display device of claim 8, wherein light emitted from the first light emitting area is configured to pass through the first refractors and travel to a first virtual light emitting area overlapping the through hole.

10. The display device of claim 8, wherein light emitted from the second light emitting area is configured to pass through the first refractors and travel to a second virtual light emitting area overlapping the hole peripheral area.

11. The display device of claim 8, wherein light emitted from the third light emitting area is configured to pass through the first refractors and travel to a third virtual light emitting area overlapping the display area.

12. The display device of claim 1, wherein the second inorganic layer includes second refractors having a second inclination angle.

13. The display device of claim 12, wherein the second inclination angle is the same as the first inclination angle.

14. The display device of claim 12, wherein the second inclination angle is greater than the first inclination angle.

15. The display device of claim 12, further comprising a third inorganic layer disposed on the second inorganic layer.

16. The display device of claim 15, wherein the second inorganic layer includes a plurality of second voids formed between the second refractors.

17. The display device of claim 16, wherein at least a portion of the second voids are filled with the third inorganic layer.

* * * * *